(12) United States Patent
Chen

(10) Patent No.: US 12,317,597 B2
(45) Date of Patent: May 27, 2025

(54) DISPLAY PANEL AND DISPLAY DEVICE

(71) Applicant: Xiamen Tianma Display Technology Co., Ltd., Xiamen (CN)

(72) Inventor: Guoxing Chen, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 21 days.

(21) Appl. No.: 18/091,745

(22) Filed: Dec. 30, 2022

(65) Prior Publication Data

US 2023/0133301 A1 May 4, 2023

(30) Foreign Application Priority Data

Jun. 30, 2022 (CN) .......................... 202210773013.7

(51) Int. Cl.
*H10D 86/60* (2025.01)
*G09G 3/20* (2006.01)
*H10D 86/40* (2025.01)

(52) U.S. Cl.
CPC .............. *H10D 86/60* (2025.01); *G09G 3/20* (2013.01); *H10D 86/441* (2025.01); *G09G 2300/0426* (2013.01); *G09G 2300/043* (2013.01); *G09G 2300/08* (2013.01)

(58) Field of Classification Search
CPC .............. H01L 27/124; H01L 27/1225; H01L 29/78633; H01L 27/1218; H01L 27/1255; H01L 27/156; G09G 3/20; G09G 2300/0426; G09G 2300/043; G09G 2300/08; G09G 3/32; H10K 59/60; H10K 59/131
See application file for complete search history.

(56) References Cited

U.S. PATENT DOCUMENTS

| | | | | |
|---|---|---|---|---|
| 10,580,848 B1* | 3/2020 | Ma | ......... | H10K 59/131 |
| 11,527,600 B2* | 12/2022 | Kim | ......... | H10K 50/80 |
| 11,587,991 B2* | 2/2023 | Han | ......... | H10K 59/00 |
| 11,694,613 B2* | 7/2023 | Hsieh | ......... | G09G 3/3208 |
| | | | | 345/694 |
| 2008/0024459 A1* | 1/2008 | Poupyrev | ......... | G06F 3/0488 |
| | | | | 345/173 |
| 2019/0051670 A1* | 2/2019 | Bei | ......... | H01L 27/124 |
| 2019/0051718 A1* | 2/2019 | Zhang | ......... | G09G 3/3225 |

(Continued)

FOREIGN PATENT DOCUMENTS

| | | | |
|---|---|---|---|
| CN | 113160742 A | 7/2021 | |
| CN | 113160743 A * | 7/2021 | ........... G09G 3/3208 |

(Continued)

*Primary Examiner* — Benyam Ketema
(74) *Attorney, Agent, or Firm* — KDW Firm PLLC

(57) ABSTRACT

Provided are a display panel and a display device. The display panel includes a first display region, a second display region and a first function region. The second display region includes a first signal line extending in the second direction and including a first segment and a second segment that are separated by the first function region. The first display region includes a first display sub-region. The first display sub-region includes a third signal line extending in the second direction and electrically connected to the first segment and the second segment. In the same pixel circuit of the first display sub-region, the second signal line and the third signal line are located on the same side of a fourth signal line.

20 Claims, 25 Drawing Sheets

(56) References Cited

U.S. PATENT DOCUMENTS

| | | | |
|---|---|---|---|
| 2019/0123066 A1* | 4/2019 | Zhan | H01L 27/124 |
| 2019/0197949 A1* | 6/2019 | Kim | G09G 3/3266 |
| 2020/0044006 A1* | 2/2020 | Lee | H10K 59/12 |
| 2020/0064702 A1* | 2/2020 | Yeh | G02F 1/136286 |
| 2020/0161401 A1* | 5/2020 | Liu | H10K 59/126 |
| 2020/0176542 A1* | 6/2020 | Park | H10K 59/131 |
| 2020/0227505 A1* | 7/2020 | Kim | H10K 59/80 |
| 2021/0012687 A1* | 1/2021 | Li | G06F 1/1652 |
| 2022/0157860 A1* | 5/2022 | Zhu | H01L 27/1218 |
| 2022/0254815 A1* | 8/2022 | Dai | H01L 27/124 |
| 2023/0093268 A1* | 3/2023 | Chen | G11C 19/28 |
| | | | 345/55 |
| 2023/0133301 A1* | 5/2023 | Chen | H01L 27/1218 |
| | | | 345/211 |
| 2023/0337492 A1* | 10/2023 | Feng | G09G 3/3233 |
| 2023/0343794 A1* | 10/2023 | Feng | H10K 59/131 |
| 2023/0345785 A1* | 10/2023 | Feng | H10K 59/1315 |

FOREIGN PATENT DOCUMENTS

| | | | | |
|---|---|---|---|---|
| CN | 113223409 A | * | 8/2021 | G09F 9/30 |
| WO | WO-2023040276 A1 | * | 3/2023 | H01L 27/124 |

* cited by examiner

DISPLAY PANEL AND DISPLAY DEVICE

CROSS-REFERENCE TO RELATED APPLICATION

This application claims priority to Chinese Patent Application No. 202210773013.7 filed Jun. 30, 2022, the disclosure of which is incorporated herein by reference in its entirety.

TECHNICAL FIELD

The present disclosure relates to the field of display technologies and, in particular, to a display panel and a display device.

BACKGROUND

In an existing display device, due to the need to integrate a front camera, a fingerprint recognition element and an infrared sensing element, holes are dug in the display panel to form a function region. External light can enter a photosensitive assembly located under the display panel through the function region on the display panel.

Since signal lines around the function region need to be correspondingly connected around the function region, a wider bezel needs to be disposed around the function region to provide sufficient winding space, affecting the screen-to-body ratio of the display panel and not satisfying the market demand for narrow bezel.

SUMMARY

The present disclosure provides a display panel and a display device to reduce the bezel area around the function region and increase the screen-to-body ratio.

According to an aspect of the present disclosure, a display panel is provided.

The display panel includes a first display region, a second display region and a first function region. The first display region is adjacent to the first function region in a first direction, and the second display region is adjacent to the first function region in a second direction, where the first direction intersects the second direction. The second display region includes a first signal line extending in the second direction, the first signal line is configured to supply a first type of signal to a pixel circuit of the second display region, and the first signal line includes a first segment and a second segment that are separated by the first function region. The first display region includes a first display sub-region. The first display sub-region includes a second signal line and a third signal line that extend in the second direction, the second signal line is configured to supply the first type of signal to a pixel circuit of the first display sub-region, and the third signal line is electrically connected to the first segment and the second segment. The display panel further includes a fourth signal line extending in the second direction and configured to transmit a second type of signal. In a same pixel circuit of the first display sub-region, the second signal line and the third signal line are located on a same side of the fourth signal line.

According to another aspect of the present disclosure, a display device is provided and includes the display panel described in the first aspect.

It is to be understood that the contents described in this part are not intended to identify key or important features of the embodiments of the present disclosure and are not intended to limit the scope of the present disclosure. Other features of the present disclosure will become readily understood through the description hereinafter.

BRIEF DESCRIPTION OF DRAWINGS

To illustrate solutions in embodiments of the present disclosure more clearly, the drawings used in description of the embodiments will be briefly described below. Apparently, the drawings described below illustrate part of embodiments of the present disclosure, and those of ordinary skill in the art may obtain other drawings based on the drawings described below on the premise that no creative work is done.

DETAILED DESCRIPTION

The solutions in embodiments of the present disclosure will be described clearly and completely in conjunction with the drawings in the embodiments of the present disclosure from which the solutions will be better understood by those skilled in the art. Apparently, the embodiments described below are part, not all, of the embodiments of the present disclosure. Based on the embodiments described herein, all other embodiments obtained by those skilled in the art are within the scope of the present disclosure on the premise that no creative work is done.

It is to be noted that the terms "first", "second" and the like in the description, claims and drawings of the present disclosure are used for distinguishing between similar objects and are not necessarily used for describing a particular order or sequence. It is to be understood that the data used in this way is interchangeable where appropriate so that the embodiments of the present disclosure described herein may also be implemented in a sequence not illustrated or described herein. In addition, terms "comprising", "including" and any other variations thereof are intended to encompass a non-exclusive inclusion. For example, a process, method, system, product or device that includes a series of steps or units not only includes the expressly listed steps or units, but may also include other steps or units that are not expressly listed or are inherent to such process, method, product or device.

Figure 1:
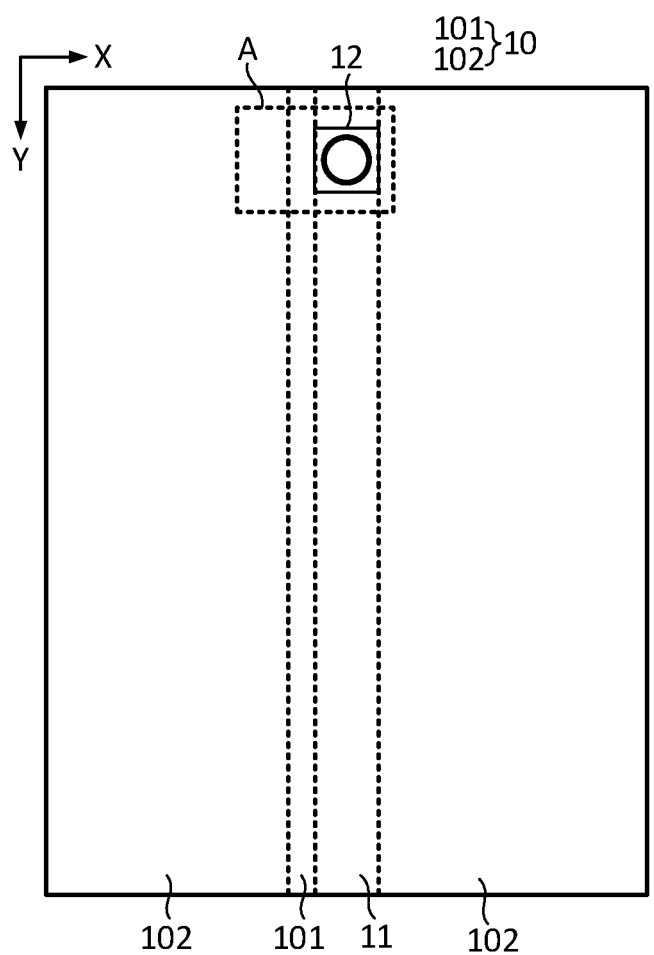
FIG. 1 is a diagram illustrating the structure of a display panel according to embodiments of the present disclosure.
Figure 2:
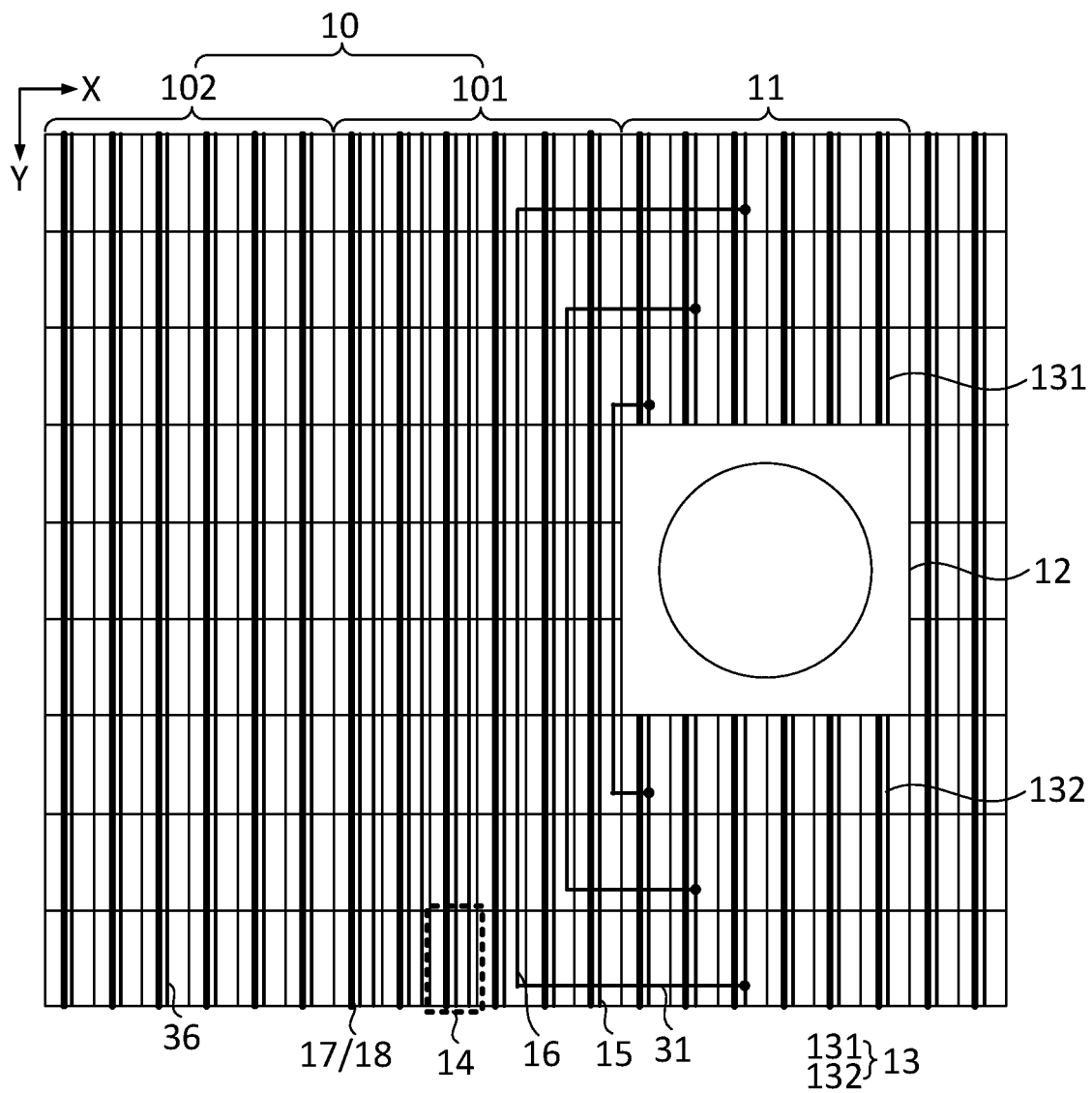
FIG. 2 is an enlarged view of the structure of part A of FIG. 1.

FIG. 1 is a diagram illustrating the structure of a display panel according to embodiments of the present disclosure. FIG. 2 is an enlarged view of the structure of part A of FIG. 1. As shown in FIG. 1 and FIG. 2, the display panel according to this embodiment of the present disclosure includes a first display region 10, a second display region 11 and a first function region 12. The first display region 10 is adjacent to the first function region 12 in the first direction X. The second display region 11 is adjacent to the first function region 12 in the second direction Y. The first direction X intersects the second direction Y. The second display region 11 includes a first signal line 13 extending in the second direction Y, the first signal line is configured to supply the first type of signal to a pixel circuit 14 of the second display region 11, and the first signal line includes a first segment 131 and a second segment 132 that are separated by the first function region 12. The first display region 10 includes a first display sub-region 101 including a second signal line 15 and a third signal line 16 that extend in the second direction Y. The second signal line 15 is configured to supply the first type of signal to a pixel circuit 14 of the first display sub-region 101. The third signal line 16 is electrically connected to the first segment 131 and the second segment 132. The display panel further includes a fourth signal line 17 extending in the second direction Y and configured to transmit the second type of signal. In the same pixel circuit 14 of the first display sub-region 101, the second signal line 15 and the third signal 16 are located on the same side of the fourth signal line 17.

Specifically, as shown in FIG. 1 and FIG. 2, the first function region 12 is configured to place a photosensitive element. The photosensitive element may be, but is not limited to, a camera, a light sensor, a distance sensor, a depth sensor, an iris recognition sensor, or an infrared sensor.

Optionally, the first function region 12 may be a non-display region. That is, the first function region 12 does not emit light to reduce the effect on the use performance of the photosensitive element.

In addition, the first function region 12 may be a rectangular region, a circular region, or an elliptical region. The position of the first function region 12 may be disposed on any side of the display panel. Those skilled in the art may configure the shape and the position of the first function region 12 according to actual needs. This is not limited in this embodiment of the present disclosure.

With continued reference to FIG. 1 and FIG. 2, the first display region 10 and the second display region 11 are disposed around the first function region 12. The first display region 10 and the second display region 11 include multiple pixel circuits 14 and multiple light-emitting elements (not shown) that are arranged in an array. The multiple pixel circuits 14 are in one-to-one correspondence with the multiple light-emitting elements. A pixel circuit 14 is configured to drive a corresponding light-emitting element to emit light so that the display function can be fulfilled.

The first display region 10 and the second display region 11 are provided with signal lines electrically connected to the multiple pixel circuits 14. The signal lines may include a data signal line, a scan signal line, a light emission control signal line, a reference voltage signal line and a power signal line so that the multiple pixel circuits 14 can be provided with various types of signals required for driving the multiple light-emitting elements to emit light.

Specifically, as shown in FIG. 1 and FIG. 2, a part of the first display region 10 is divided as the first display sub-region 101, the first display sub-region 101 is provided with the second signal line 15 extending in the second direction Y, and the second signal line is configured to supply the first type of signal to the pixel circuit 14 of the first display sub-region 101. Since the first display region 10 is adjacent to the first function region 12 in the first direction X (a direction intersecting the second direction Y), the second signal lines 15 are not separated by the first function region 12 and are continuous wires.

In the second display region 11, the first signal line 13 extending in the second direction Y is provided for supplying the first type of signal to the pixel circuit 14 of the second display region 11. Since the second display region 11 is adjacent to the first function region 12 in the second direction Y, the first signal line 13 is separated into the first segment 131 and the second segment 132 by the first function region 12.

In this embodiment, to supply the first type of signal to the pixel circuit 14 electrically connected to the same first signal line 13, the first display sub-region 101 is provided with the third signal line 16 extending in the second direction Y, by which the first segment 131 and the second segment 132 that are separated in the same first signal line 13 are connected. The first segment 131 and the second segment 132 that are separated by the first function region 12 in the first signal line 13 are connected by the third signal line 16 disposed in the first display sub-region 101, and the first signal line 13 does not need to be wound from the bezel position of the first function region 12 so that the number of signal lines in the bezel position of the first function region 12 can be reduced, the bezel area of the first function region 12 can thereby be reduced, and the screen-to-body ratio of the display panel can thereby be increased.

The first signal line 13 and the second signal line 15 may be each any one of a data signal line, a scan signal line, a light emission control signal line, a reference voltage signal line, or a power signal line. That is, the first type of signal may be any one of a data signal, a scan signal, a light emission control signal, a reference voltage signal, or a power signal. This is not limited in this embodiment of the present disclosure.

With continued reference to FIG. 1 and FIG. 2, the display panel further includes a fourth signal line 17 extending in the second direction Y and configured to transmit the second type of signal. The second type of signal may also be any one of a data signal, a scan signal, a light emission control signal, a reference voltage signal or a power signal but different from the first type of signal.

In the same pixel circuit 14 of the first display sub-region 101, the second signal line 15 and the third signal line 16 are located on the same side of the fourth signal line 17. That is, among the second signal line 15, the third signal line 16 and the fourth signal line 17 that correspond to the same pixel circuit 14, the second signal line 15 and the third signal line 16 are collectively placed on the same side of the fourth signal line 17 so that the distance between the second signal line 15 and the third signal line 16 can be closer. With this configuration, parasitic capacitances between other metal films or other signal nodes in the pixel circuit 14 and the second signal line 15 and the third signal line 16 can be at a similar level so that the loss difference between the first type of signals transmitted on the second signal line 15 and on the third signal line 16 can be reduced, thereby helping improve the display uniformity.

Optionally, the first type of signal and the second type of signal are each an alternating current signal.

The second signal line 15 corresponding to the pixel circuit 14 means the second signal line 15 connected to the pixel circuit 14. The fourth signal line 17 corresponding to the pixel circuit 14 means the fourth signal line 17 connected to the pixel circuit 14. The third signal line 16 corresponding to the pixel circuit 14 means the third signal line 16 overlapping the pixel circuit 14 or closest to the pixel circuit 14.

It is to be noted that FIG. 1 and FIG. 2 show an example in which the first display region 10 includes only one first display sub-region 101 located on only one side of the second display region 101. This is not limited thereto.

In addition, to illustrate various signal lines more clearly, the fourth signal line 17 is bolded in some drawings of the present disclosure. That is, in some drawings, the fourth signal line 17 is denoted as a thicker line segment, and the remaining thinner segment is used for transmitting the first type of signal, which does not limit the protection scope of the present disclosure.

Figure 3:
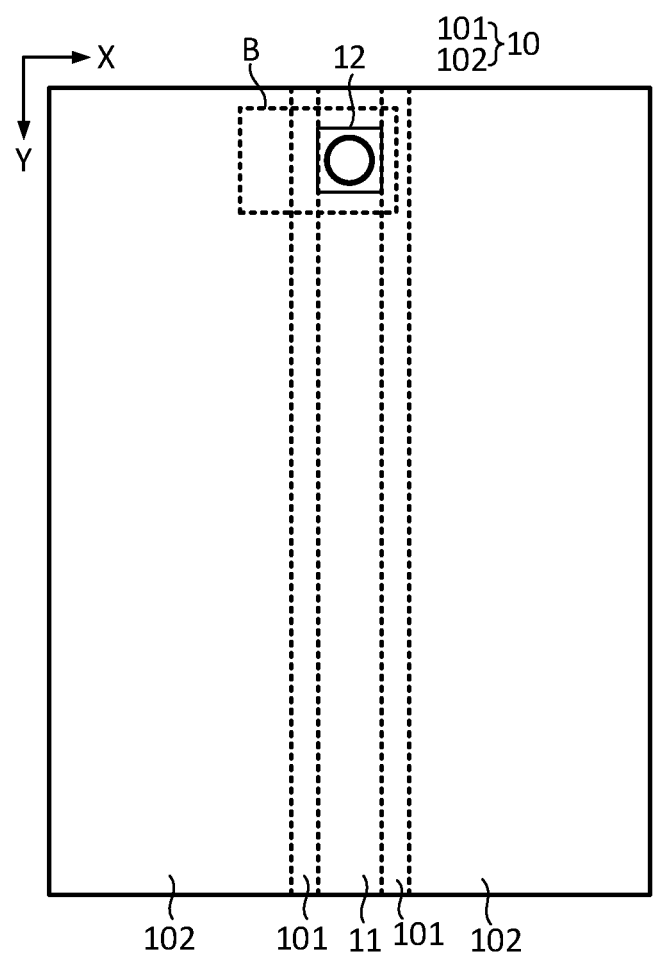
FIG. 3 is a diagram illustrating the structure of another display panel according to embodiments of the present disclosure.
Figure 4:
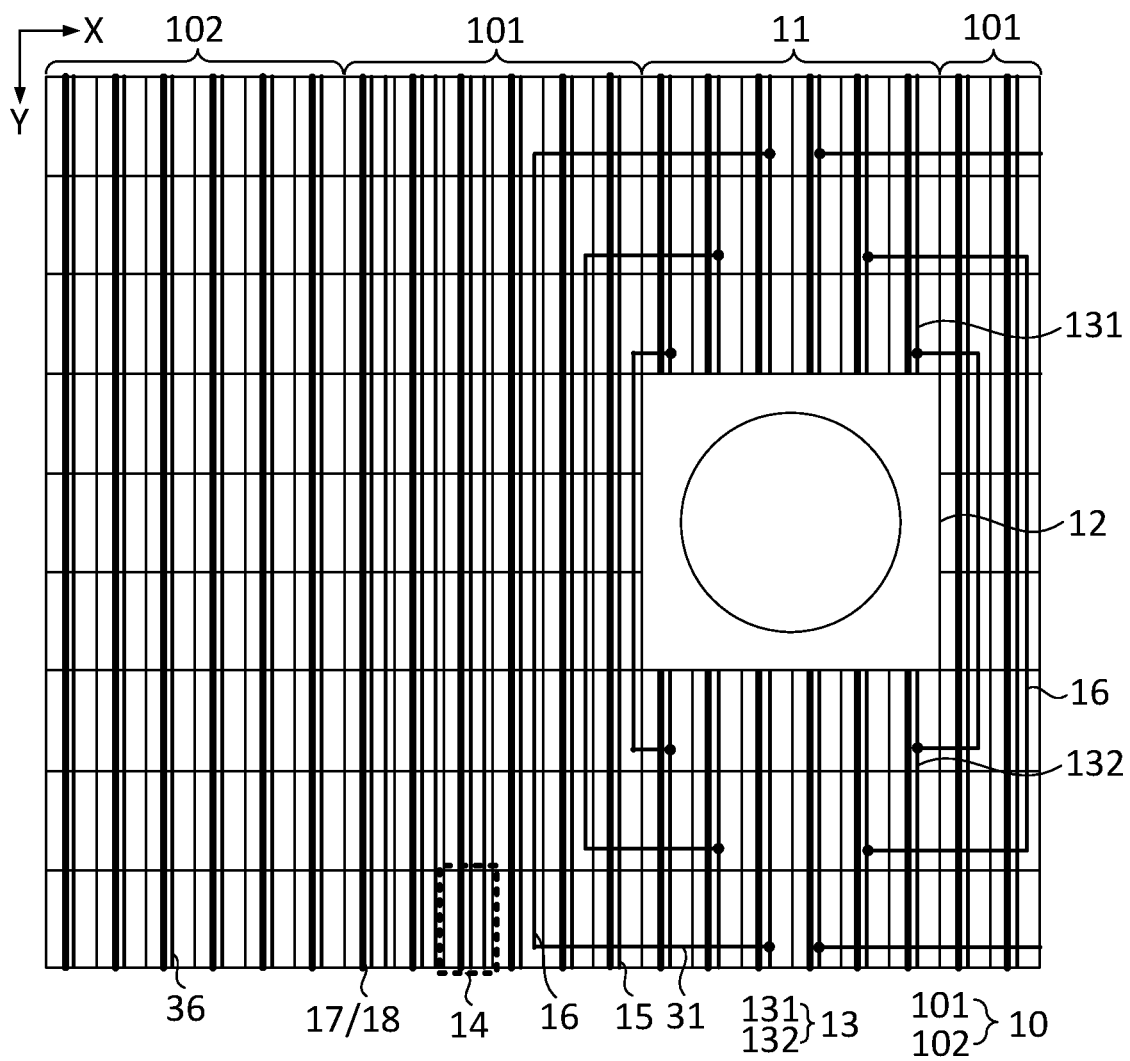
FIG. 4 is an enlarged view of the structure of part B of FIG. 3.

FIG. 3 is a diagram illustrating the structure of another display panel according to embodiments of the present disclosure. FIG. 4 is an enlarged view of the structure of part B of FIG. 3. As shown in FIG. 3 and FIG. 4, optionally, the first display region 10 includes two first display sub-regions 101 located on two sides of the second display region 11 respectively so that the connection distance between the third signal line 16 and the first signal line 13 can be reduced, thereby reducing the transmission loss of the first type of signal.

In other embodiments, the first display region 10 may further include more first display sub-regions 101. The number and the positions of the first display sub-regions 101 may be disposed according to actual needs and are not limited in this embodiment of the present disclosure.

In conclusion, in the display panel according to this embodiment of the present disclosure, the first display region 10 is provided with the first display sub-region 101, and the first display sub-region 101 is added with the third signal line 16 by which the first segment 131 and the second segment 132 that are separated by the first function region 12 in the first signal line 13 in the second display region 11 are connected so that the first type of signal can be supplied to the pixel circuit 14 electrically connected to the same first signal line 13. Meanwhile, the first segment 131 and the second segment 132 are connected by the third signal line 16 disposed in the first display sub-region 101. Compared with the related art in which the first signal line 13 is wound from the bezel position of the first function region 12, this arrangement has the following effects: The number of signal lines in the bezel position of the first function region 12 can be reduced, the bezel area of the first function region 12 can thereby be reduced, and the screen-to-body ratio of the display panel can thereby be increased.

Further, with the configuration in which the second signal line 15 and the third signal line 16 are located on the same side of the fourth signal line 17 in the same pixel circuit 14 of the first display sub-region 101, the second signal line 15 and the third signal line 16 can be collectively placed so that parasitic capacitances between other metal films or other signal nodes in the pixel circuit 14 and the second signal line 15 and the third signal line 16 can be at a similar level, and the loss difference between the data signals transmitted on the second signal line 15 and on the third signal line 16 can be reduced, thereby helping improve the display uniformity.

With continued reference to FIG. 1 and FIG. 2, optionally, the fourth signal line 17 is a first power signal line 18, and the second type of signal is a first power signal.

Specifically, the first power signal line 18 is configured to supply the first power signal to the pixel circuit 14. The first power signal is a direct current signal instead of an alternating current (AC) signal, so the first power signal line 18 can supply a constant voltage to the pixel circuit 14. The first power signal line 18 may be, for example, a PVDD signal line or a PVEE signal line. This is not limited in this embodiment of the present disclosure.

In this embodiment, the second signal line 15 and the third signal line 16 are located on the same side of the first power signal line 18 in the same pixel circuit 14 of the first display sub-region 101. That is, among the second signal line 15, the third signal line 16 and the first power signal line 18 that correspond to the same pixel circuit 14, the second signal line 15 and the third signal line 16 are collectively placed on the same side of the first power signal line 18 so that the distance between the second signal line 15 and the third signal line 16 can be closer. With this configuration, parasitic capacitances between other metal films or other signal nodes in the pixel circuit 14 and the second signal line 15 and the third signal line 16 can be at a similar level so that the loss difference between the data signals transmitted on the second signal line 15 and on the third signal line 16 can be reduced, thereby helping improve the display uniformity.

With continued reference to FIG. 1 and FIG. 2, optionally, the second signal line 15, the third signal line 16 and the fourth signal line 17 overlap the pixel circuit 14 of the first display sub-region 101 in the thickness direction of the display panel.

Specifically, as shown in FIG. 1 and FIG. 2, the vertical projections of the second signal line 15, the third signal line 16 and the fourth signal line 17 on the plane on which the display panel is located overlap the vertical projection of the pixel circuit 14 on the plane on which the display panel is located so that the second signal line 15, the third signal line 16 and the fourth signal line 17 do not need to occupy additional space, thereby improving the pixel density of the display panel and the display effect.

It is to be noted that the pixel circuit 14 includes multiple transistors, multiple transistors of the same pixel circuit 14 are generally disposed collectively, and the multiple transistors may be regarded as an integral transistor combination structure. In this present disclosure, that the vertical projections of signal lines on the plane on which the display panel is located overlap the vertical projection of the pixel circuit 4 on the plane on which the display panel is located means that the vertical projections of the signal lines on the plane on which the display panel is located overlap the vertical projection of a transistor combination structure of the pixel circuit 14 on the plane on which the display panel is located. That is, the vertical projections of the signal lines on the plane on which the display panel is located overlap the vertical projection of at least one transistor of the pixel circuit 14 on the plane on which the display panel is located, which is not repeated hereafter.

The multiple transistors may include, but are not limited to, a first light emission control transistor, a data signal write transistor, a drive transistor, a compensation transistor, a first reset transistor, a second light emission control transistor and a light emission reset transistor.

In addition, as shown in FIG. 1 and FIG. 2, the third signal line 16 overlaps the pixel circuit 14 of the first display sub-region 101 in the thickness direction of the display panel, but the third signal line 16 is not electrically connected to the pixel circuit 14 of the first display sub-region 101. That is, the third signal line 16 and the pixel circuit 14 overlapping the third signal line 16 are insulated from each other so that the mutual interference between the third signal line 16 and the pixel circuit 14 of the first display sub-region 101 can be reduced.

Figure 5:
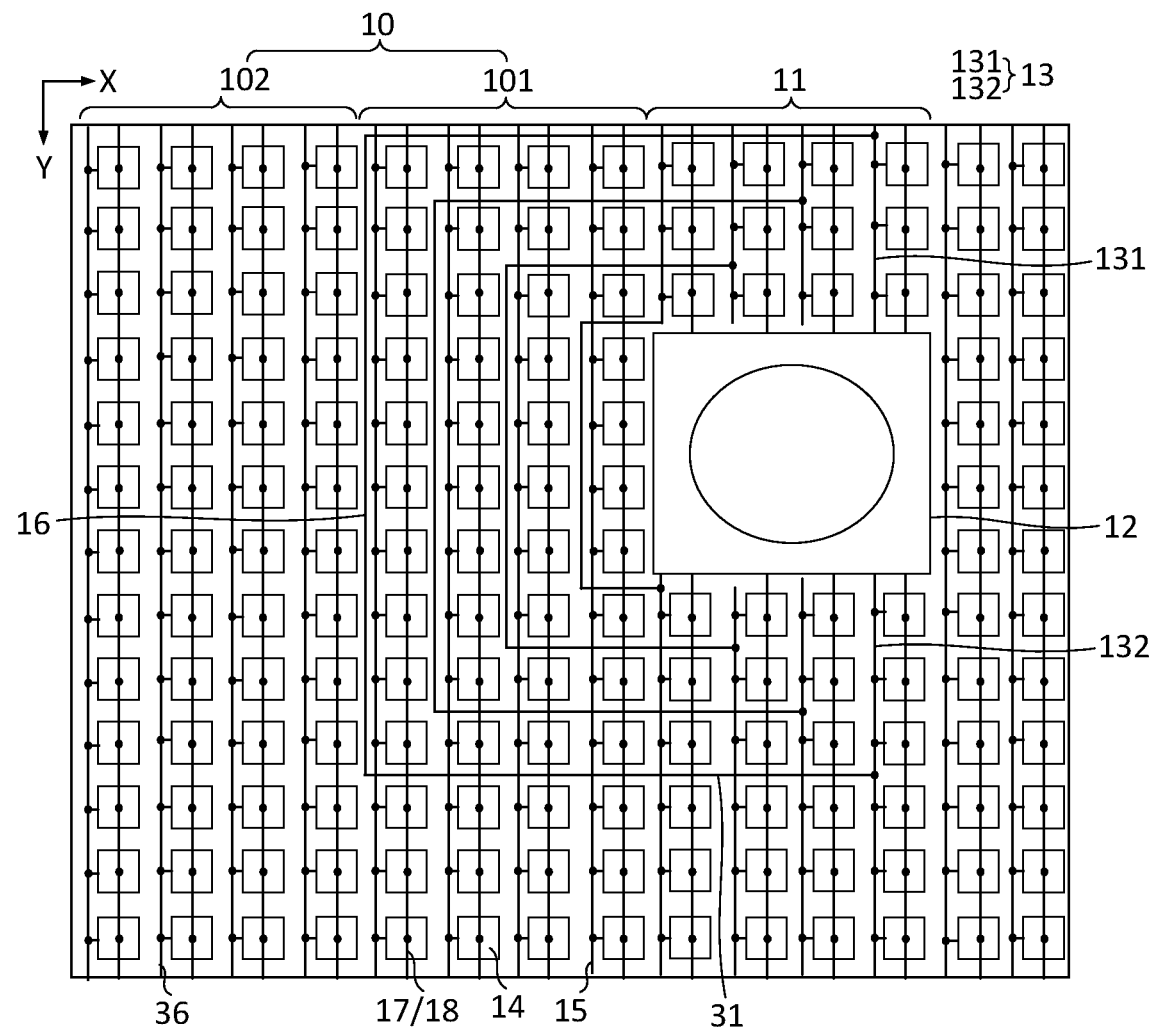
FIG. 5 is a partial view of the structure of a display panel according to embodiments of the present disclosure.

FIG. 5 is a partial view of the structure of a display panel according to embodiments of the present disclosure. As shown in FIG. 5, optionally, the second signal line 15 and the third signal line 16 may also be located in the first display sub-region 101. With this configuration, parasitic capacitances can be prevented from being formed between the first signal line 13 and the second signal line 15 and each metal film in the pixel circuit 14 so that the effect of the first signal line 13 and the second signal line 15 on the performances of the pixel circuit 14 can be reduced.

Similarly, in other embodiments, the fourth signal line 17 may also be located between two adjacent pixel circuits 14 in the first display sub-region 101 to prevent parasitic capacitances from being formed between the first signal line 13 and the second signal line 15 and each metal film in the pixel circuits 14 and reduce the effect of the first signal line 13 and the second signal line 15 on the performances of the pixel circuits 14. This is not limited in this embodiment of the present disclosure.

As described in the preceding, in the present disclosure, a signal line located between the two adjacent pixel circuits 14 means that the signal line is located between transistor combination structures of the two adjacent pixel circuits 14. That is, the vertical projection of the signal line on the plane on which the display panel is located does not overlap the vertical projections of the transistors of the two adjacent pixel circuits 14 on the plane on which the display panel is located. This is not repeated here.

With continued reference to FIGS. 1 to 5, optionally, in the same pixel circuit 14, the third signal line 16 is located on one side of the second signal line 15 facing the fourth signal line 17, or the third signal line 16 is located on one side of the second signal line 15 facing away from the fourth signal line 17.

Exemplarily, as shown in FIGS. 1 to 5, among the second signal line 15, the third signal line 16 and the fourth signal line 17 that correspond to the same pixel circuit 14, the third signal line 16 may be located on one side of the second signal line 15 facing away from the fourth signal line 17 so that the connection distance between the second signal line 15 and the pixel circuit 14 can be reduced, thereby helping reduce the transmission loss of the first type of signal.

Figure 6:
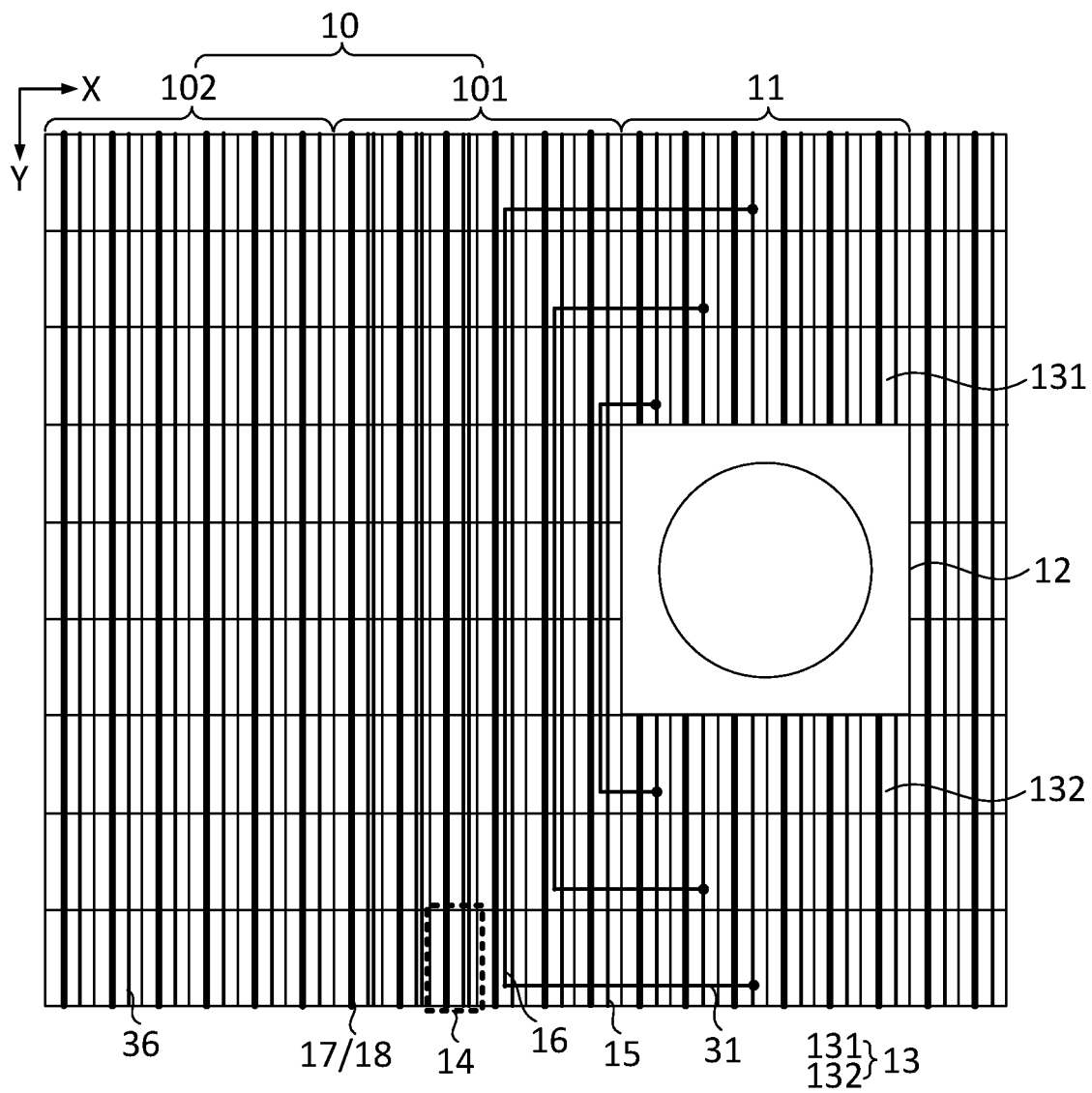
FIG. 6 is a partial view of the structure of another display panel according to embodiments of the present disclosure.

FIG. 6 is a partial view of the structure of another display panel according to embodiments of the present disclosure. As shown in FIG. 6, exemplarily, among the second signal line 15, the third signal line 16 and the fourth signal line 17 that correspond to the same pixel circuit 14, the third signal line 16 may also be located on one side of the second signal line 15 facing the fourth signal line 17 so that the flexibility in the design of the third signal line 16 can be improved, thereby matching the third signal line 16 and the pixel circuit 14. For example, when there is a larger distance between the second signal line 15 and the fourth signal line 17 in the pixel circuit 14, the third signal line 16 may be disposed between the second signal line 15 and the fourth signal line 17 so that the pixel density of the display panel can be improved.

Figure 7:
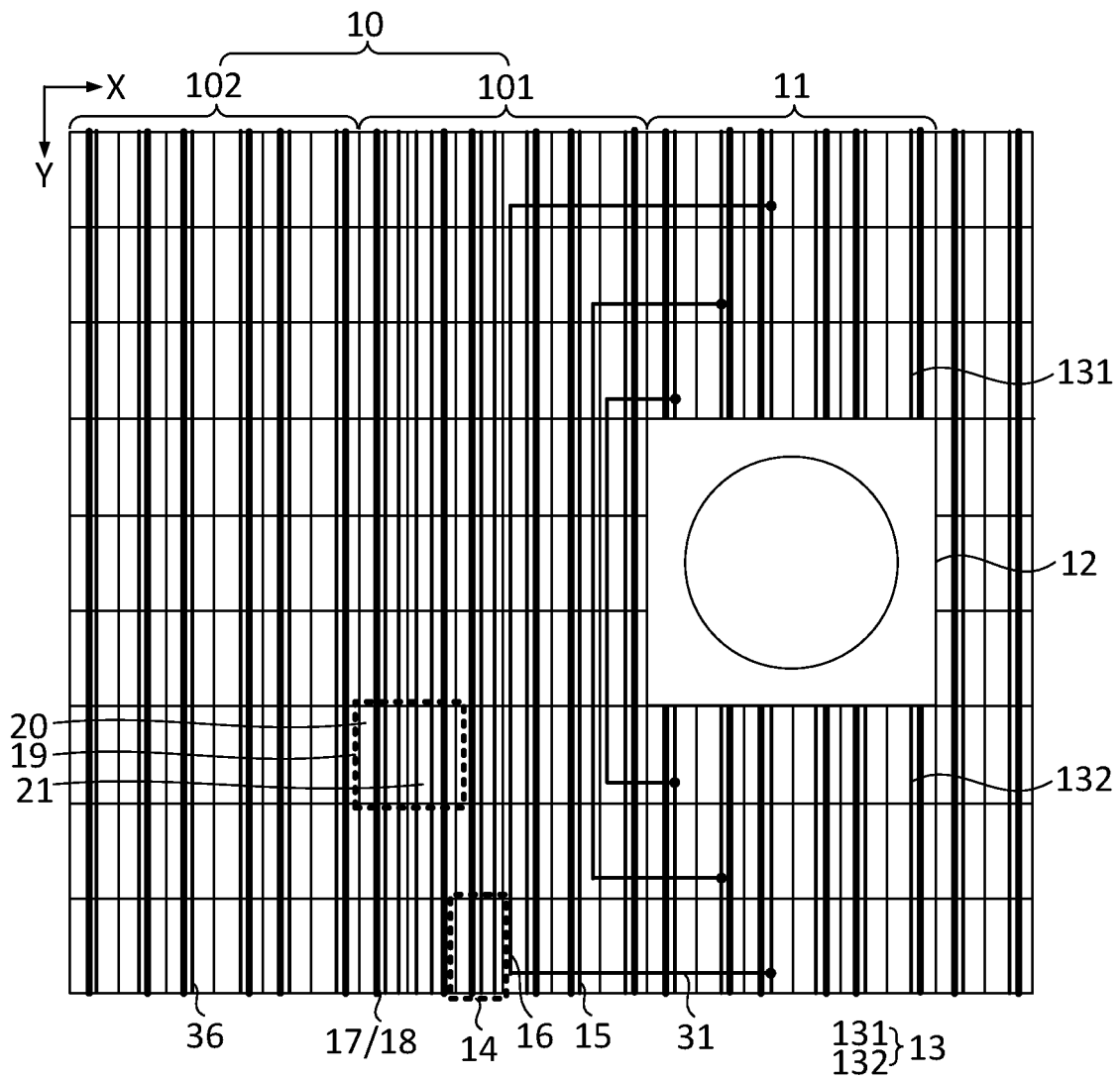
FIG. 7 is a partial view of the structure of another display panel according to embodiments of the present disclosure.
Figure 8:
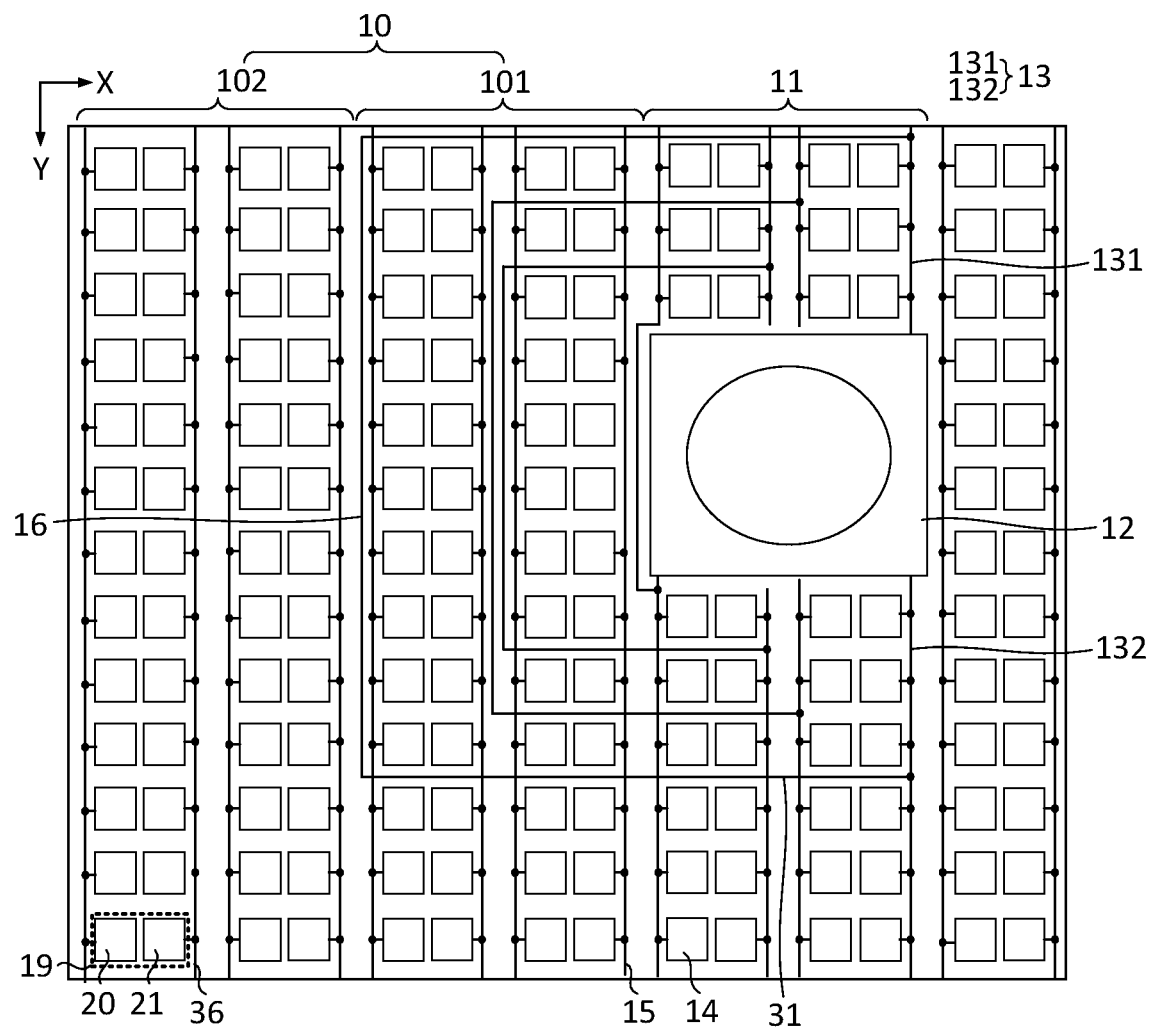
FIG. 8 is a partial view of the structure of another display panel according to embodiments of the present disclosure.
Figure 9:
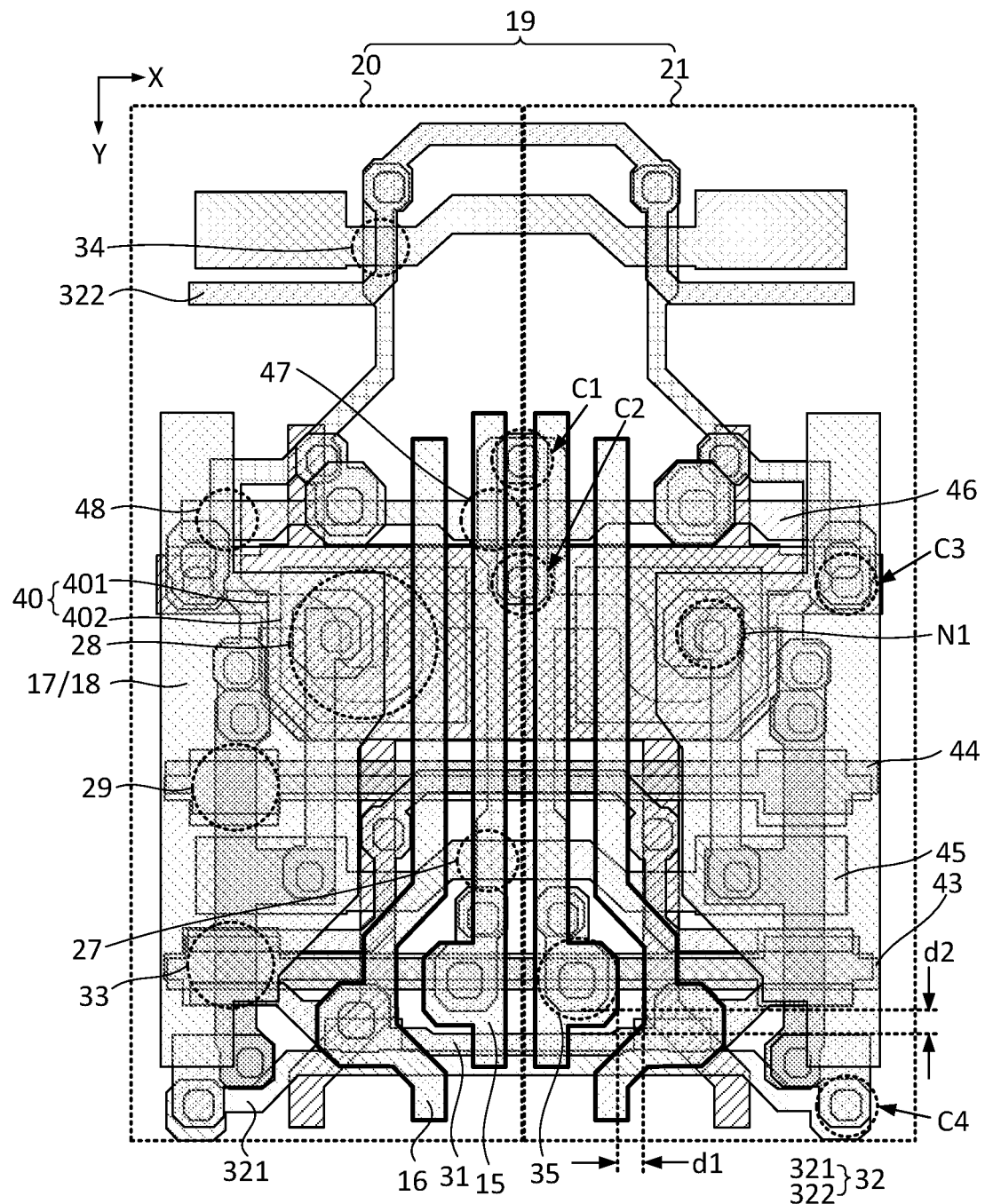
FIG. 9 is a diagram illustrating the layout structure of a pixel circuit group according to embodiments of the present disclosure.

FIG. 7 is a partial view of the structure of another display panel according to embodiments of the present disclosure. FIG. 8 is a partial view of the structure of another display panel according to embodiments of the present disclosure. FIG. 9 is a diagram illustrating the layout structure of a pixel circuit group according to embodiments of the present disclosure. As shown in FIGS. 7 to 9, optionally, the display panel according to this embodiment of the present disclosure includes a pixel circuit group 19. The pixel circuit group 19 includes a first pixel circuit 20 and a second pixel circuit 21. The first pixel circuit 20 and the second pixel circuit 21 are adjacent to each other in the first direction and are arranged in a mirror-image.

Specifically, as shown in FIGS. 7 to 9, pixel circuits 14 are divided into multiple pixel circuit groups 19, and a pixel circuit group 19 includes two adjacent pixel circuits 14 that are a first pixel circuit 20 and a second pixel circuit 21. With the configuration in which the first pixel circuit 20 and the second pixel circuit 21 are in a mirror-image arrangement, when the first pixel circuit 20 and the second pixel circuit 21 are connected to part of signal lines, the first pixel circuit 20 and the second pixel circuit 21 can share the same one connection through hole so that the number of punching holes can be reduced, thereby helping improve the transmittance of the display panel. In this manner, when the display panel is provided with such a photosensitive element as an under-screen fingerprint recognition module, the use performance of the photosensitive element can be improved.

Exemplarily, as shown in FIG. 9, connection through holes C1, C2, C3 and C4 are the connection through holes respectively between the pixel circuit 14 and the corresponding signal lines. If the first pixel circuit 20 and the second pixel circuit 21 are not in a mirror-image arrangement, the first pixel circuit 20 needs to be provided with a group of connection through holes C1, C2, C3 and C4, and the second pixel circuit 21 also needs to be provided with a group of connection through holes C1, C2, C3 and C4. That is, one pixel circuit group 19 needs to be provided with two groups of connection through holes C1, C2, C3 and C4. In this embodiment, with the configuration in which the first pixel circuit 20 and the second pixel circuit 21 are in a mirror-image arrangement, the first pixel circuit 20 and the second pixel circuit 21 can share the same one group of connection through holes C1, C2, C3 and C4 so that the configuration of one group of connection through holes C1, C2, C3 and C4 can be saved. One pixel circuit group 19 can satisfy the potential requirement of the first pixel circuit 20 and the second pixel circuit 21 by being provided with only one group of connection through holes C1, C2, C3 and C4 so that the transmittance of the display panel can be improved.

It is to be noted that the first pixel circuit 20 and the second pixel circuit shown in FIG. 9 share the connection through hole C1 and C2, and the connection through holes C3 and C4 marked in the second pixel circuit 21 are shared by the second pixel circuit 21 shown in FIG. 9 and a first pixel circuit 20 (not shown) adjacent to the right side of the second pixel circuit 21 shown in FIG. 9. It is to be understood that when two adjacent pixel circuits 14 are in a mirror-image arrangement, the number of connection through holes can be reduced at the junction of the two adjacent pixel circuits 14 by sharing the connection through holes so that the transmittance of the display panel can be improved.

It is to be noted that as shown in FIG. 9, the second signal line 15 and the third signal line 16 are located on the same side of the fourth signal line 17 in the same pixel circuit 14 of the first display sub-region 101, that is, among the second signal line 15, the third signal line 16 and the fourth signal line 17 that correspond to the same pixel circuit 14, the second signal line 15 and the third signal line 16 are collectively placed on the same side of the fourth signal line 17 so that the distance between the second signal line 15 and the third signal line 16 can be closer. With this configuration, parasitic capacitances between the second signal line 15 and the third signal line 16 and metal films or signal nodes in the pixel circuit 14 can be at a similar level so that the loss difference between the first type of signals transmitted on the second signal line 15 and on the third signal line 16 can be reduced, thereby helping improve the display uniformity.

It is to be noted that, to illustrate the positional relationship of the second signal line 15 and the third signal line 16 clearly, the outline of the second signal line 15 and the outline of the third signal line 16 are thickened in FIG. 9, which does not limit the protection scope of the present disclosure.

With continued reference to FIGS. 7 to 9, optionally, in the same pixel circuit group 19 of the first display sub-region 101, in the first direction X, the second signal line 15 is located between two third signal lines 16, or the third signal line 16 is located between two second signal lines 15.

Specifically, as shown in FIG. 7 and FIG. 8, that the third signal line 16 is located between two second signal lines 15 is used as an example. Two third signal line 16 may be collectively placed, compared with the configuration in which the second signal line 15 and the third signal line 16 are alternately disposed in the first direction X, so that the mutual interference between the second signal line 15 and the third signal line 16 can be reduced. In this manner, the first type of signal transmitted on the second signal line 15 and on the third signal line 16 can be more accurate and more stable so that the driving performance of the pixel circuit 14 can be improved.

Figure 10:
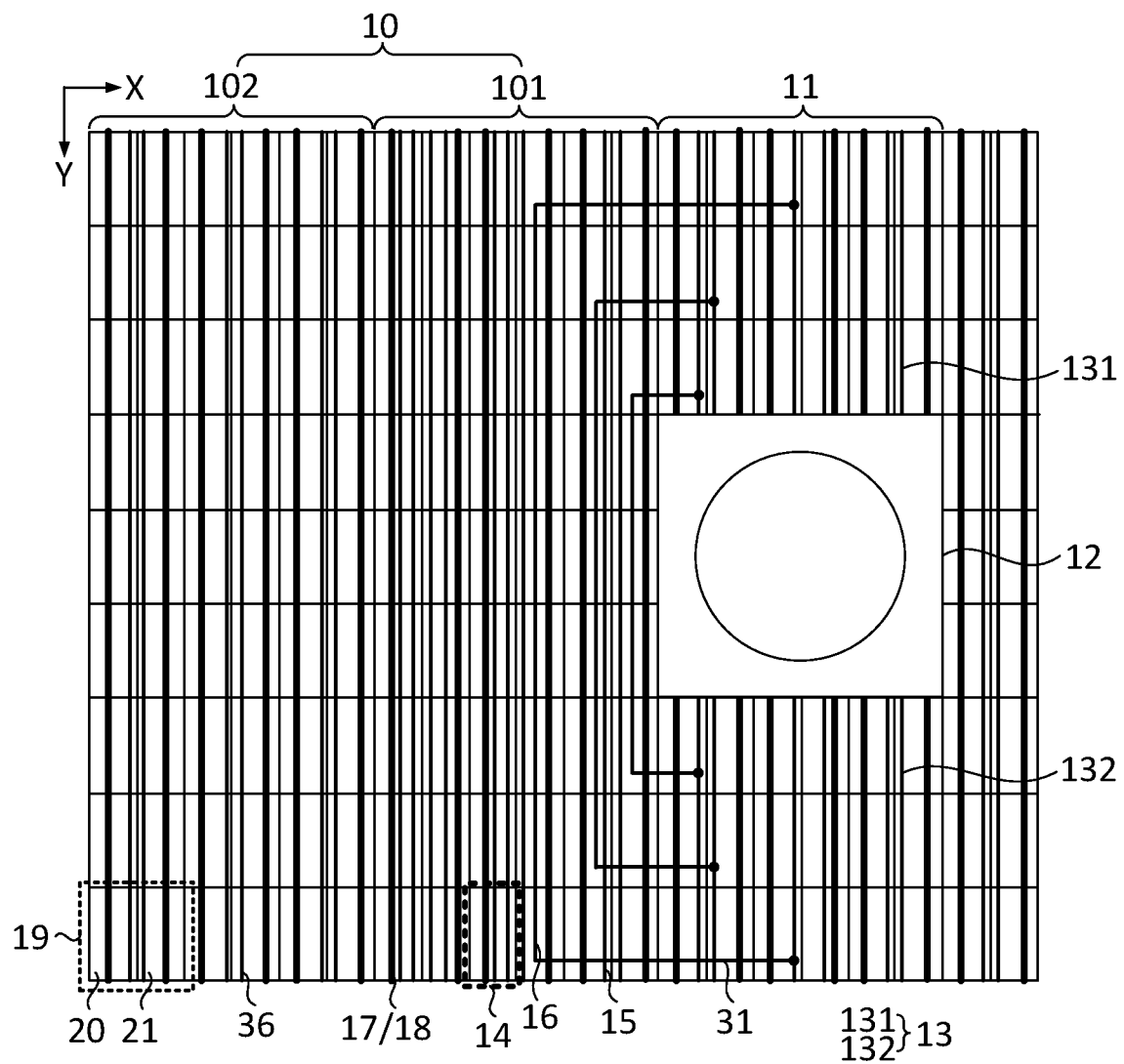
FIG. 10 is a partial view of the structure of another display panel according to embodiments of the present disclosure.

FIG. 10 is a partial view of the structure of another display panel according to embodiments of the present disclosure. As shown in FIG. 9 and FIG. 10, optionally, the second signal line 15 is located between two third signal lines 16 in the same pixel circuit group 19 of the first display sub-region 101 so that two second signal lines 15 can be collectively placed. Compared with the configuration in which the second signal line 15 and the third signal line 16 are alternatively disposed in the first direction X, this configuration can reduce the mutual interference between the second signal line 15 and the third signal line 16. In this manner, the first type of signal transmitted on the second signal line 15 and on the third signal line 16 can be more accurate and more stable so that the driving performance of the pixel circuit 14 can be improved.

It is to be noted that the pixel circuit group shown in FIG. 9 is located in the first display sub-region 101.

Figure 11:
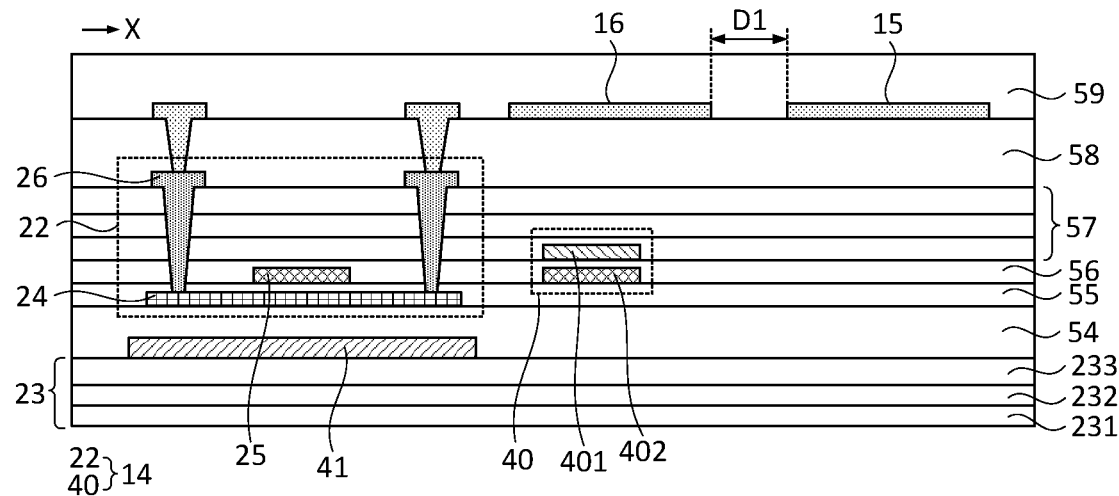
FIG. 11 is a partial section view of the structure of a display panel according to embodiments of the present disclosure.

FIG. 11 is a partial section view of the structure of a display panel according to embodiments of the present disclosure. As shown in FIG. 9 and FIG. 11, optionally, the second signal line 15 and the third signal line 16 are located in the same film.

As shown in FIG. 9 and FIG. 11, optionally, with the configuration in which the second signal line 15 and the third signal line 16 are disposed in the same film, in the thickness direction of the display panel, the second signal line 15 and the third signal line 16 can have the basically same vertical distances from other metal films in the pixel circuit 14 so that parasitic capacitances between other metal films in the pixel circuit 14 and the second signal line 15 and the third signal line 16 can be at a similar level, and the loss difference between the data signals transmitted on the second signal line 15 and on the third signal line 16 can be reduced, thereby improving the display uniformity.

Meanwhile, with this configuration in which the second signal line 15 and the third signal line 16 are disposed in the same film, the configuration of a metal layer can be saved by not disposing an additional metal layer for the third signal line 16 so that the production cost and the thickness of the display panel can be reduced. Moreover, the third signal line 16 may use the same material as the second signal line 15 so that the third signal line 16 and the second signal line 15 can be prepared in the same process, thereby shortening the preparation time.

It is to be noted that the specific film positions of the second signal line 15 and the third signal line 16 may be disposed according to actual needs.

Exemplarily, as shown in FIG. 11, the pixel circuit 14 includes a first thin-film transistor 22. The first thin-film transistor 22 includes a first active layer 24, a first gate layer 25 and a first source-drain electrode layer 26 that are stacked on one side of a base substrate 23. The second signal line 15 and the third signal line 16 may be disposed on one side of the first source-drain electrode layer 26 facing away from the base substrate 23. The second signal line 15 and the third signal line 16 may be formed using a Ti/Al/Ti metal stack. Al has a smaller resistance so that the resistances of the second signal line 15 and the third signal line 16 can be reduced, and the line loss of the first type of signal on the second signal line 15 and the third signal line 16 can be reduced, thereby reducing the voltage drops of the first type of signal on the second signal line 15 and on the third signal line 16 and helping improve the display uniformity.

It is to be noted that the specific film positions of the second signal line 15 and the third signal line 16 are not limited to the preceding embodiment, and the second signal line 15 and the third signal line 16 may also be disposed in the same layer as any metal film, such as the first gate layer 25 and the first source-drain electrode layer 26, in other embodiments. This is not limited in this embodiment of the present disclosure.

Exemplarily, as shown in FIG. 11, the pixel circuit 14 further includes a storage capacitor 40. The storage capacitor 40 includes a first plate 401 and a second plate 402. The first plate 401 is located on one side of the second plate 402 facing away from the base substrate 23. The second signal line 15 and the third signal line 16 may also be disposed in the same layer as the first plate 401 or the second plate 402.

In addition, as shown in FIG. 11, one side of the first active layer 24 facing the base substrate 23 is provided with a light-shielding metal layer 41, and in the thickness direction of the display panel, the light-shielding metal layer 41 overlaps the first active layer 24. The light-shielding metal layer 41 is configured to shield the channel formed by the first active layer 24 to prevent light from shining on the first active layer 24 so that the first active layer 24 can be prevented from affecting the off-state current of the first thin-film transistor 22 due to exposure to light, thereby preventing light from adversely affecting the first thin-film transistor 22. Optionally, the second signal line 15 and the third signal line 16 may also be disposed in the same layer as the light-shielding metal layer 41, but are not limited to the preceding embodiment.

With continued reference to FIG. 9 and FIG. 11, optionally, in the first direction X, the distance between the second signal line 15 and the third signal line 16 is d1, where d1≥2.5 μm.

As shown in FIG. 11, with the configuration in which the distance d1 between the second signal line 15 and the third signal line 16 is greater than or equal to 2.5 μm, the mutual interference between the second signal line 15 and the third signal line 16 caused by a too close distance between the second signal line 15 and the third signal line 16 can be prevented so that the first type of signal transmitted on the second signal line 15 and on the third signal line 16 can be more accurate and more stable, thereby improving the driving performance of the pixel circuit 14.

It is to be noted that the specific value of the distance d1 between the second signal line 15 and the third signal line 16 may be disposed according to actual needs and is not limited in this embodiment of the present disclosure. It is to be understood that the larger the distance d1 between the second signal line 15 and the third signal line 16, the smaller the mutual interference between the second signal line 15 and the third signal line 16, but the smaller the distance d1 between the second signal line 15 and the third signal line 16, the more advantageous it is to compress the size of the pixel circuit 14 so that the pixel density of the display panel can be improved.

Figure 12:
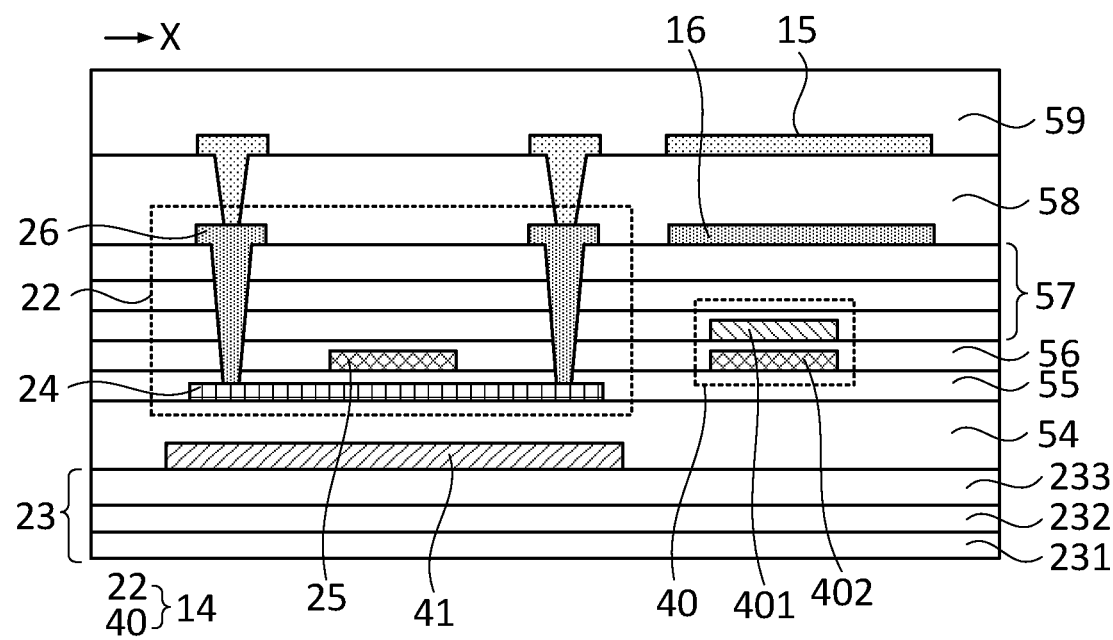
FIG. 12 is a partial section view of the structure of another display panel according to embodiments of the present disclosure.

FIG. 12 is a partial section view of the structure of another display panel according to embodiments of the present disclosure. As shown in FIG. 12, optionally, the second signal line 15 and the third signal line 16 are located in different films and, in the thickness direction of the display panel, at least partially overlap.

Specifically, as shown in FIG. 12, with the configuration in which the second signal line 15 and the third signal line 16 are located in different layers, compared with the configuration in which the second signal line 15 and the third signal line 16 are located in the same layer, the second signal line 15 and the third signal line 16 can at least partially overlap in the thickness direction of the display panel so that the overall projection area of the second signal line 15 and the third signal line 16 on the plane on which the display panel is located can be reduced, thereby helping improve the transmittance of the display panel.

Exemplarily, as shown in FIG. 12, the second signal line 15 may be disposed on one side of the first source-drain electrode layer 26 facing away from the base substrate 23. The second signal line 15 may be formed using a Ti/Al/Ti metal stack, and since Al has a smaller resistance, the resistance of the second signal line 15 can be reduced so that the line loss of the first type of signal on the second signal line 15 can be reduced, thereby reducing the voltage drop of the first type of signal on the second signal line 15 and helping improve the display uniformity.

Meanwhile, the third signal line 16 may be disposed in the same layer as the first source-drain electrode layer 26. The metal film in which the first source-drain electrode layer 26 is located is generally formed using a Ti/Al/Ti metal stack, and the third signal line 16 disposed in the film in which the first source-drain electrode layer 26 is located can reduce the line loss of the first type of signal on the third signal line 16 so that the voltage drop of the first type of signal on the third signal line 16 can be reduced, and the display uniformity can be improved.

It is to be noted that the specific film positions of the second signal line 15 and the third signal line 16 are not limited to the preceding embodiment, and the second signal line 15 and the third signal line 16 may also be disposed in the same layer as any metal film, such as the first gate layer 25, the first source-drain electrode layer 26, the first plate 401, the second plate 402 or the light-shielding metal layer 41, in other embodiments. This is not limited in this embodiment of the present disclosure.

Optionally, the first type of signal is a data signal.

The first signal line 13 and the second signal line 15 may be each a data signal line. The first type of signal transmitted on the first signal line 13 and on the second signal line 15 is a data signal.

Figure 13:
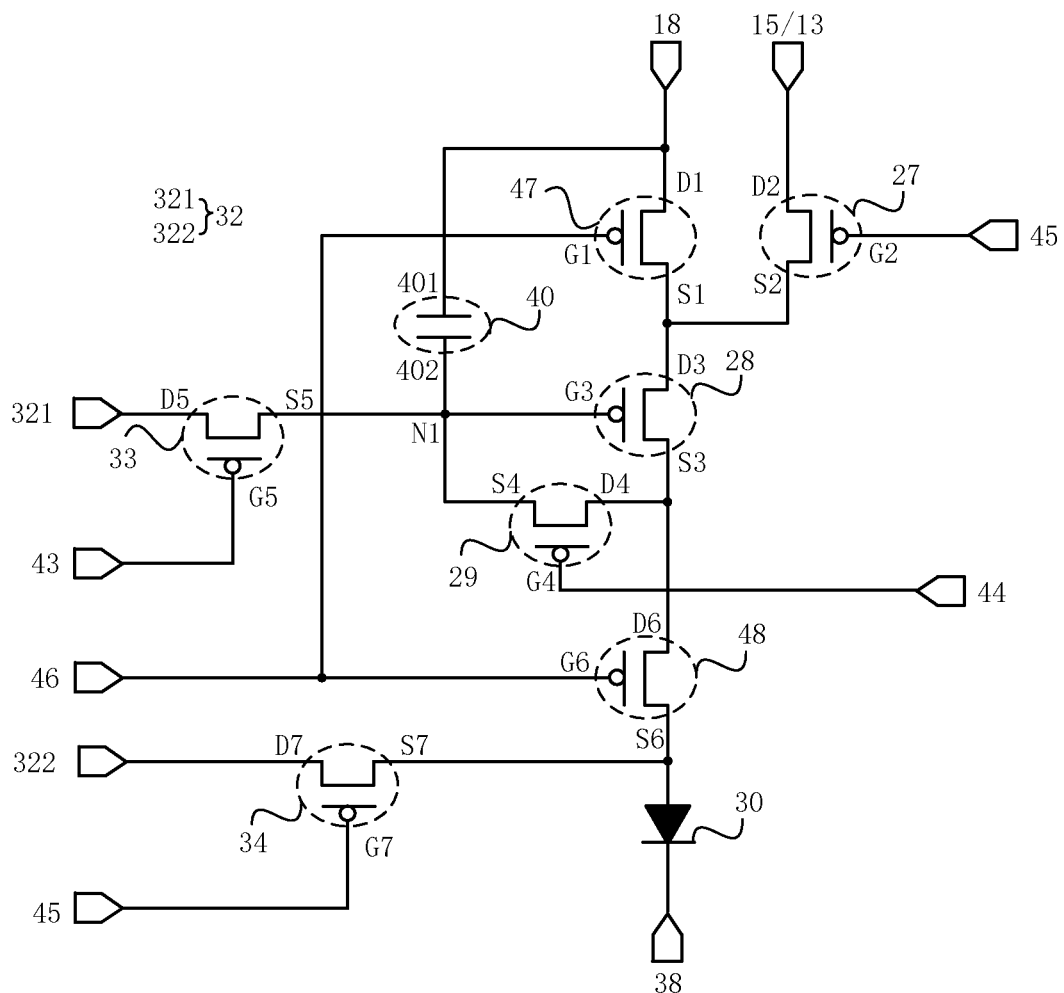
FIG. 13 is a diagram illustrating the structure of a pixel circuit according to embodiments of the present disclosure.

FIG. 13 is a diagram illustrating the structure of a pixel circuit according to embodiments of the present disclosure. As shown in FIG. 9 and FIG. 13, exemplarily, the pixel circuit 14 includes a data signal write transistor 27, a drive transistor 28 and a compensation transistor 29. The drive transistor 28 is connected in series between the first power signal line 18 and a light-emitting element 30. The first electrode D3 of the drive transistor 28 is electrically connected to the first electrode S2 of the data signal write transistor 27, the second electrode S3 of the drive transistor 28 is electrically connected to the first electrode D4 of the compensation transistor 29, and the second electrode S4 of the compensation transistor 29 is electrically connected to the gate G3 of the drive transistor 28. In the pixel circuit 14 of the first display sub-region 101, the second electrode D2 of the data signal write transistor 27 is electrically connected to the second signal line 15. In the pixel circuit 14 of the second display region 11, the second electrode D2 of the data signal write transistor 27 is electrically connected to the first signal line 13.

The light-emitting element 30 is configured to emit light in the light emission stage so that the light emission function of the display panel or the display function of the display panel can be fulfilled.

The drive transistor 28 may be turned on according to the potential of the gate of the drive transistor 28, and the drive current formed by turning on the drive transistor 28 is configured to drive the light-emitting element 30 to emit light.

The driving process of the pixel circuit 14 may include the following.

In the data signal voltage write stage, the data signal write transistor 27, the compensation transistor 29 and the drive transistor 29 are turned on, so in the pixel circuit 14 of the first display sub-region 101, a data signal voltage on the second signal line 15 is applied to a first node N1 (that is, the gate G3 of the drive transistor 28) through the data signal write transistor 27, the drive transistor 28 and the compensation transistor 29; in the pixel circuit 14 of the second display region 11, a data signal voltage on the first signal line 13 is applied to the first node N1 (that is, the gate G3 of the drive transistor 28) through the data signal write transistor 27, the drive transistor 28 and the compensation transistor 29.

In the light emission stage, a first power signal on the first power signal line 18 is transmitted to the light-emitting element 30 through the drive transistor 28 so that the drive current generated by the drive transistor 28 can be supplied to the light-emitting element 30 to drive the light-emitting element 30 to emit light.

In this embodiment, with the configuration in which the first signal line 13 and the second signal line 15 transmit the data signal, the first segment 131 and the second segment 132 that are separated by the first function region 12 in the first signal line 13 in the second display region 11 are connected by the third signal line 16 added in the first display sub-region 101 so that the data signal can be supplied to the pixel circuit 14 electrically connected to the same first signal line 13. The first signal line 13 does not need to be wound from the bezel position of the first function region 12 so that the number of data signal lines in the bezel position of the first function region 12 can be reduced, thereby reducing the bezel area of the first function region 12 and increasing the screen-to-body of the display panel.

Further, as shown in FIG. 9, that the fourth signal line 17 is the first power signal line 18 is used as an example. The second signal line 15, the third signal line 16 and the first power signal line 18 have the same extending direction. In the same pixel circuit 14 of the first display sub-region 101, with the configuration in which the second signal line 15 and the third signal line 16 are located on the same side of the first power signal line 18, the second signal line 15 and the third signal line 16 can be collectively placed so that parasitic capacitances between other metal films or other signal nodes in the pixel circuit 14 and the second signal line 15 and the third signal line 16 can be at a similar level, and the loss difference between the data signals transmitted on the second signal line 15 and on the third signal line 16 can be reduced, thereby helping improve the display uniformity.

It is to be noted that the first type of signal transmitted by the second signal line 15 and the third signal line 16 is not limited to the preceding embodiment and may also be a scan signal or a light emission control signal in other embodiments. This is not limited in this embodiment of the present disclosure.

Exemplarily, the first signal line 13 and the second signal line 15 may be each a data signal line, and the first type of signal transmitted on the first signal line 13 and on the second signal line 15 is a scan signal. With the configuration in which the first signal line 13 and the second signal line 15 transmit the scan signal, the first segment 131 and the second segment 132 that are separated by the first function region 12 in the first signal line 13 in the second display region 11 are connected by the third signal line 16 added in the first display sub-region 101 so that the scan signal can be supplied to the pixel circuit 14 electrically connected to the same first signal line 13. The first signal line 13 does not need to be wound from the bezel position of the first function region 12 so that the number of scan signal lines in the bezel position of the first function region 12 can be reduced, thereby reducing the bezel area of the first function region 12 and improving the screen-to-body of the display panel.

When the first type of signal transmitted on the first signal line 13 and on the second signal line 15 is a scan signal, the second signal line 15 and the third signal 16 can be disposed in different layers and can at least partially overlap in the thickness direction of the display panel so that the overall projection area of the second signal line 15 and the third signal line 16 on the plane on which the display panel is located can be reduced, thereby helping improve the transmittance of the display panel. Meanwhile, when the first type of signal transmitted on the first signal line 13 and on the second signal line 15 is a scan signal, the preceding configuration can also help reduce the signal coupling between the second signal line 15 and the third signal line 16 and improve the driving performance of the pixel circuit 14.

With continued reference to FIGS. 1 to 10, optionally, the display panel according to this embodiment of the present disclosure further includes a first connection line 31 extending in the first direction X, and the first connection line 31 is configured to connect the first signal line 13 in the second display region 11 to the third signal line 16 in the first display sub-region 101.

As shown in FIGS. 1 to 10, with the configuration of the first connection line 31 extending in the first direction X, the first segment 131 and the second segment 132 of the third signal line 16 can be led to the first display sub-region 101 so that the first segment 131 and the second segment 132 can be connected to the third signal line 16.

With continued reference to FIGS. 2, 4, 6, 7, 9 and 10, optionally, the first connection line 31 overlaps the pixel circuit 14 in the thickness direction of the display panel.

As shown in FIGS. 2, 4, 6, 7, 9 and 10, the vertical projection of the first connection line 31 on the plane on which the display panel is located overlaps the vertical projection of the pixel circuit 14 on the plane on which the display panel is located so that the first connection line 31 does not need to occupy additional space, thereby helping improve the pixel density of the display panel.

With continued reference to FIG. 5 and FIG. 8, optionally, the first connection line 31 may also be located between two adjacent pixel circuits 14 so that a parasitic capacitor can be prevented from being formed between the first connection line 31 and each metal film in the pixel circuits 14, thereby reducing the effect of the first connection line 31 on the performances of the pixel circuits 14.

It is to be noted that the first connection line 31 located in the display region (specifically, in the first display sub-region 101 and the second display region) can reduce the number of connection lines disposed in the bezel of the first function region 12, and even connection lines cannot be disposed in the bezel of the first function region 12 so that the bezel area of the first function region 12 can be reduced, and the screen-to-body of the array substrate can be increased.

Figure 14:
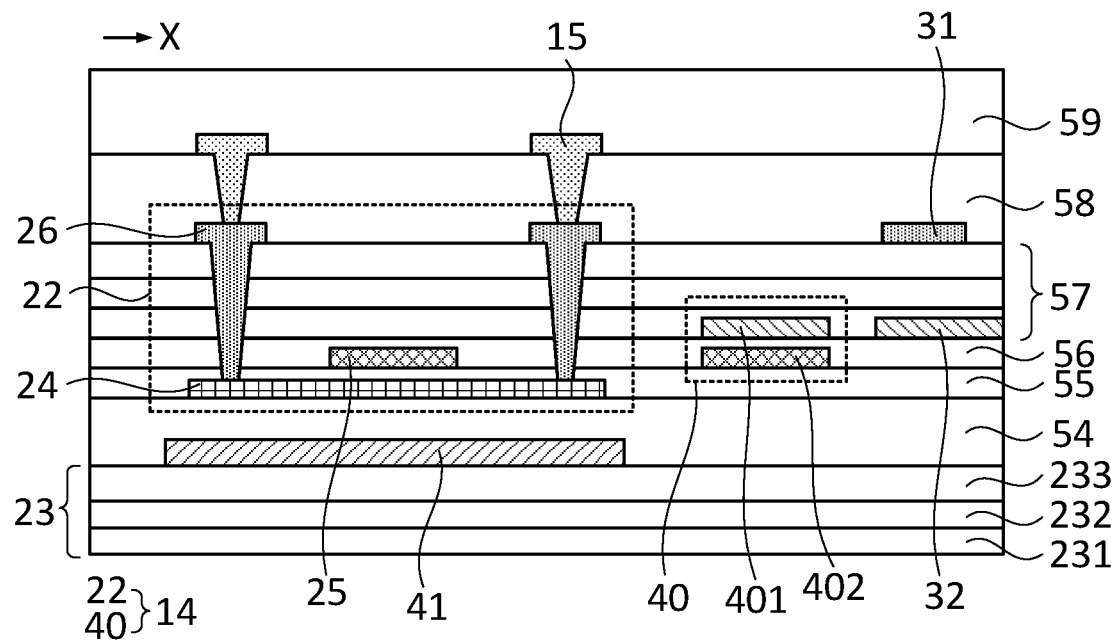
FIG. 14 is a partial section view of the structure of another display panel according to embodiments of the present disclosure.

FIG. 14 is a partial section view of the structure of another display panel according to embodiments of the present disclosure. As shown in FIG. 9 and FIG. 14, optionally, the first connection line 31 and the third signal line 16 are located in different films.

Specifically, as shown in FIG. 9 and FIG. 14, the first connection line 31 and the third signal line 16 are located in different films, and the first connection line 31 and the third signal line 16 connected to the first connection line 31 are connected by punching.

As shown in FIGS. 1 to 10, the first connection line 31 extends in the first direction X, and the first signal line 13, the second signal line 15, the third signal line 16 and the fourth signal line 17 extend in the second direction Y. Therefore, the first connection line 31 overlaps part of wires in the first signal line 13, the second signal line 15, the third signal line 16 and the fourth signal line 17. In this embodiment, with the configuration in which the first connection line 31 and the third signal line 16 are located in different layers, when the first connection line 31 needs to be connected to the third signal line 16, the connection is performed by punching; when the first connection line 31 does not need to be connected to the third signal line 16, punching does not need to be performed. In this manner, the preparation process is simple and easy to implement. Moreover, when the third signal line 16 is disposed in the same layer as any of the first signal line 13, the second signal line 15 or the fourth signal line 17, since the first connection line 31 and the third signal line 16 are located in different films, it is not required to configure the first connection line 31 to use a jump wire to avoid the signal lines in the same layer as the third signal line 16 so that the structure can be simpler, and the reliability of the display panel can be improved.

Exemplarily, as shown in FIG. 9 and FIG. 14, the third signal line 16 may be disposed on one side of the first source-drain electrode layer 26 facing away from the base substrate 23. The third signal line 16 may be formed using a Ti/Al/Ti metal stack, and since Al has a smaller resistance, the resistance of the third signal line 16 can be reduced so that the line loss of the first type of signal on the third signal line 16 can be reduced, thereby reducing the voltage drop of the first type of signal on the third signal line 16 and helping improve the display uniformity.

Meanwhile, the first connection line 31 may be disposed in the same layer as the first source-drain electrode layer 26. The metal film in which the first source-drain electrode layer 26 is located is generally formed using a Ti/Al/Ti metal stack, and the third signal line 31 disposed in the film in which the first source-drain electrode layer 26 is located can reduce the line loss of the first type of signal on the first connection line 31 so that the voltage drop of the first type of signal on the first connection line 31 can be reduced, and the display uniformity can be improved.

Further, as shown in FIG. 9 and FIG. 14, the first connection line 31 and the third signal line 16 are located in adjacent metal films, and in the thickness direction of the display panel, the distance between the first connection line 31 and the third signal line 16 may be closer so that the punching connection can be facilitated.

It is to be noted that the specific film positions of the first connection line 31 and the third signal line 16 are not limited to the preceding embodiment, and the first connection line 31 and the third signal line 16 may also be disposed in the same layer as any metal film, such as the first gate layer 25, the first source-drain electrode layer 26, the first plate 401, the second plate 402 or the light-shielding metal layer 41, in other embodiments. This is not limited in this embodiment of the present disclosure.

Figure 15:
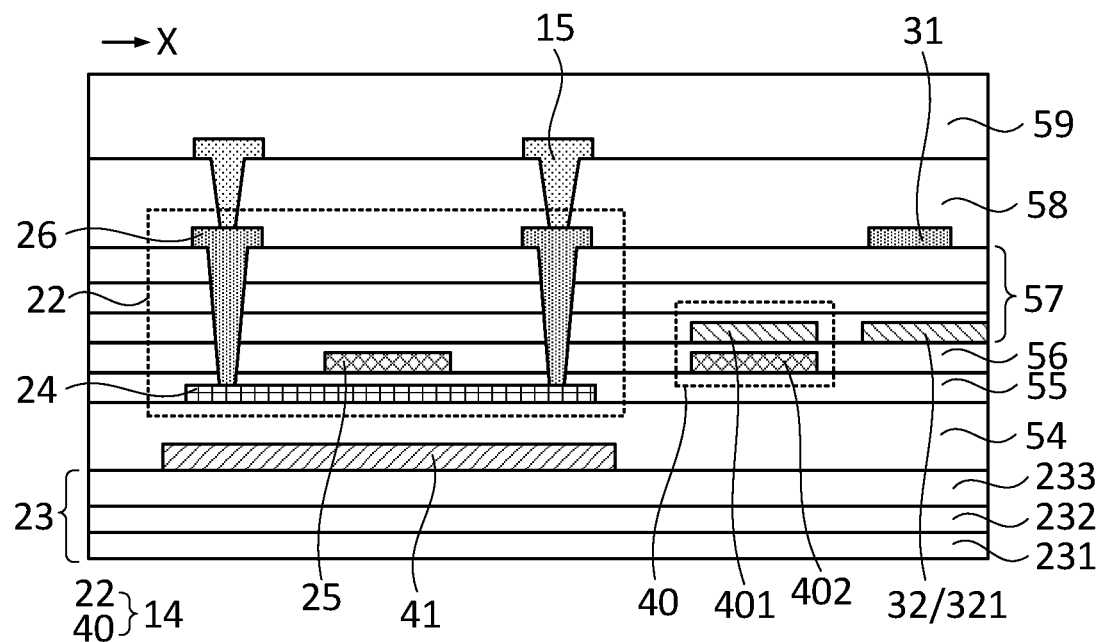
FIG. 15 is a partial section view of the structure of another display panel according to embodiments of the present disclosure.

FIG. 15 is a partial section view of the structure of another display panel according to embodiments of the present disclosure. As shown in FIG. 9 and FIG. 15, optionally, the display panel further includes a reference voltage signal line 32 extending in the first direction X, and the reference voltage signal line 32 is configured to supply a reference voltage signal to the pixel circuit 14, and the first connection line 31 and the reference voltage signal line 32 are insulated from each other and, in the thickness direction of the display panel, at least partially overlap.

Specifically, as shown in FIG. 9 and FIG. 15, the first connection line 31 and the reference voltage signal line 31 have the same extending direction and are insulated from each other to prevent the mutual interference between signals on the first connection line 31 and on the reference voltage signal line 32.

As shown in FIG. 9 and FIG. 15, the vertical projection of the first connection line 31 on the plane on which the display panel is located at least partially overlaps the vertical projection of the reference voltage signal line 32 on the plane on which the display panel is located so that the overall projection area of the first connection line 31 and the reference voltage signal line 32 on the plane on which the display panel is located can be reduced, thereby improving the transmittance of the display panel. In this manner, when the display panel is provided with such a photosensitive element as an under-screen fingerprint recognition module, the use performance of the photosensitive element can be improved.

Meanwhile, since a reference voltage signal transmitted by the reference voltage signal line 32 is a direct current signal, that is, the voltage on the reference voltage signal line 32 is a constant voltage, and the first connection line 31 and the reference voltage signal line 32 at least partially overlap in the thickness direction of the display panel, the mutual interference between the first connection line 31 and the reference voltage signal line 32 can be reduced.

Moreover, since the voltage on the reference voltage signal line 32 is a constant voltage, with the configuration in which the first connection line 31 and the reference voltage signal line 32 at least partially overlap, the reference voltage signal line 32 can also shield the first connection line 31 so that the effect between other metal films or other signal nodes in the pixel circuit 14 and the first connection line 31 can be reduced.

Figure 16:
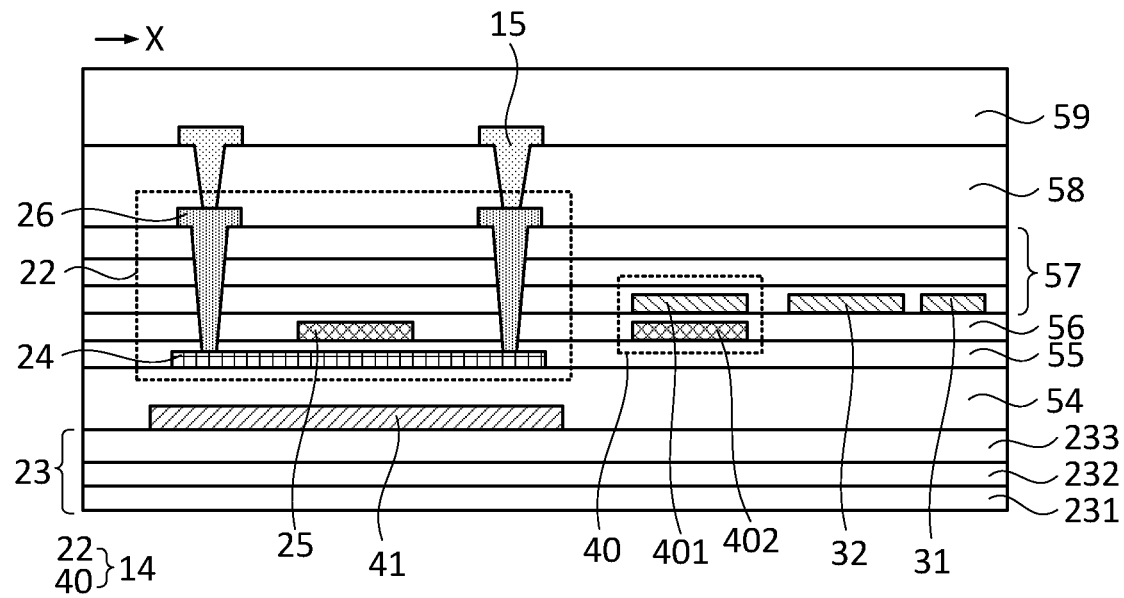
FIG. 16 is a partial section view of the structure of another display panel according to embodiments of the present disclosure.

FIG. 16 is a partial section view of the structure of another display panel according to embodiments of the present disclosure. As shown in FIG. 16, optionally, the first connection line 31 and the reference voltage signal line 32 are located in the same film.

As shown in FIG. 16, with the configuration in which the first connection line 31 and the reference voltage signal line 32 are located in the same film, the configuration of a metal layer can be saved by not disposing an additional metal layer for the first connection line 31 so that the production cost and the thickness of the display panel can be reduced. Moreover, the first connection line 31 may use the same material as the reference voltage signal line 32 so that the first connection line 31 and the reference voltage signal line 32 can be prepared in the same process, thereby shortening the preparation time.

With continued reference to FIGS. 9, 13 and 15, optionally, the display panel according to this embodiment of the present disclosure further includes the first power signal line 18 configured to transmit the first power signal. The reference voltage signal line 32 includes a first reference voltage signal line 321. The pixel circuit 14 includes the drive transistor 28 and a first reset transistor 33. The drive transistor 28 is connected in series between the first power signal line 18 and the light-emitting element 30. The gate G3 of the drive transistor 28 is electrically connected to the first electrode S5 of the first reset transistor 33, and the second electrode D5 of the first reset transistor 33 is electrically connected to the first reference voltage signal line 321. The first connection line 31 and the first reference voltage signal line 321 are located in different films and, in the thickness direction of the display panel, at least partially overlap.

The drive transistor 28 may be turned on according to the potential of the gate of the drive transistor 28, and the drive current formed by turning on the drive transistor 28 is configured to drive the light-emitting element 30 to emit light.

The driving process of the pixel circuit 14 may further include the following.

In the initialization stage, the first reset transistor 33 is turned on, so a first reference voltage on the first reference voltage signal line 321 is applied to the first node N1 through the first reset transistor 33, that is, the potential of the first node N1 is the first reference voltage. At this time, the potential of the gate G3 of the drive transistor 28 is also the first reference voltage so that the first node N1 (the gate G3 of the drive transistor 28) can be reset.

As shown in FIG. 9 and FIG. 15, the vertical projection of the first connection line 31 on the plane on which the display panel is located and the vertical projection of the first reference voltage signal line 321 on the plane on which the display panel is located at least partially overlap so that the overall projection area of the first connection line 31 and the first reference voltage signal line 321 on the plane on which the display panel is located can be reduced, thereby improving the transmittance of the display panel. In this manner, when the display panel is provided with such a photosensitive element as an under-screen fingerprint recognition module, the use performance of the photosensitive element can be improved.

Meanwhile, since the first reference voltage signal transmitted by the first reference voltage signal line 321 is a direct current signal, that is, the voltage on the first reference voltage signal line 321 is a constant voltage, and the first connection line 31 and the first reference voltage signal line 321 at least partially overlap in the thickness direction of the display panel, the mutual interference between the first connection line 31 and the first reference voltage signal line 321 can be reduced.

Moreover, since the voltage on the first reference voltage signal line 321 is a constant voltage, with the configuration in which the first connection line 31 and the first reference voltage signal line 321 at least partially overlap, the first reference voltage signal line 321 can also shield the first connection line 31 so that the effect between other metal films or other signal nodes in the pixel circuit 14 and the first connection line 31 can be reduced.

Figure 17:
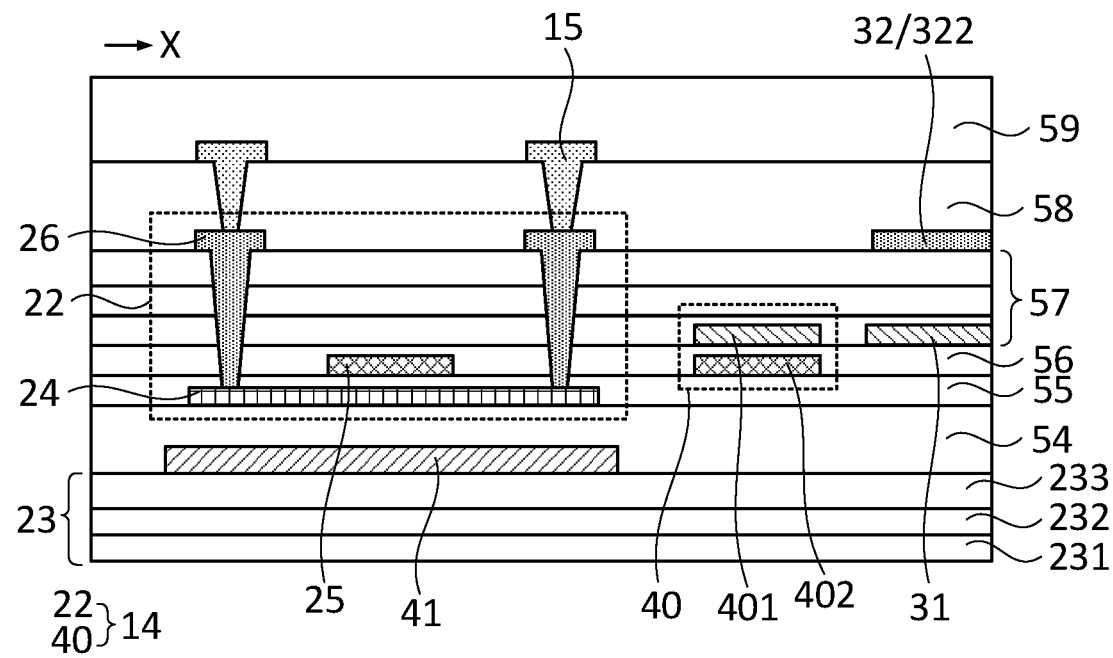
FIG. 17 is a partial section view of the structure of another display panel according to embodiments of the present disclosure.

FIG. 17 is a partial section view of the structure of another display panel according to embodiments of the present disclosure. As shown in FIGS. 9, 13 and 17, optionally, the display panel further includes the first power signal line 18 configured to transmit the first power signal. The reference voltage signal line 32 includes a second reference voltage signal line 322, and the pixel circuit 14 includes the drive transistor 28 and a light emission reset transistor 34. The drive transistor 28 is connected in series between the first power signal line 18 and the light-emitting element 30. The anode of the light-emitting element 30 is electrically connected to the first electrode S7 of the light emission reset transistor 34, and the second electrode D7 of the light emission reset transistor 34 is electrically connected to the second reference voltage signal line 322.

As shown in FIG. 17, the first connection line 31 and the second reference voltage signal line 322 are located in different films and, in the thickness direction of the display panel, at least partially overlap.

The drive transistor 28 may be turned on according to the potential of the gate of the drive transistor 28, and the drive current formed by turning on the drive transistor 28 is configured to drive the light-emitting element 30 to emit light.

The driving process of the pixel circuit 14 may further include the following.

In the data signal voltage write stage, the light emission reset transistor 34 is turned on, so the light emission reset transistor 34 writes a second reference voltage on the second reference voltage signal line 322 into the anode of the light-emitting element 30 so that the anode of the light-emitting element 30 can be reset, the effect of the voltage of the anode of the light-emitting element 30 of the previous frame on the voltage of the anode of the light-emitting element 30 of the subsequent frame can be reduced, and the display uniformity can be improved.

As shown in FIG. 17, the vertical projection of the first connection line 31 on the plane on which the display panel is located and the vertical projection of the second reference voltage signal line 322 on the plane on which the display panel is located at least partially overlap so that the overall projection area of the first connection line 31 and the second reference voltage signal line 322 on the plane on which the display panel is located can be reduced, thereby helping improve the transmittance of the display panel. In this manner, when the display panel is provided with such a photosensitive element as an under-screen fingerprint recognition module, the use performance of the photosensitive element can be improved.

Meanwhile, since the second reference voltage signal transmitted by the second reference voltage signal line 322 is a direct current signal, that is, the voltage on the second reference voltage signal line 322 is a constant voltage, and the first connection line 31 and the second reference voltage signal line 322 at least partially overlap in the thickness direction of the display panel, the mutual interference between the first connection line 31 and the second reference voltage signal line 322 can be reduced.

Moreover, since the voltage on the second reference voltage signal line 322 is a constant voltage, with the configuration in which the first connection line 31 and the second reference voltage signal line 322 at least partially overlap, the second reference voltage signal line 322 can also shield the first connection line 31 so that the effect between other metal films or other signal nodes in the pixel circuit 14 and the first connection line 31 can be reduced.

As shown in FIG. 9, optionally, the first reference voltage signal line 321 and the second reference voltage signal line 322 are located in different films.

Exemplarily, as shown in FIG. 9 and FIG. 15, the first reference voltage signal line 321 may be disposed in the same layer as the first plate 401 so that the configuration of a metal layer can be saved, thereby reducing the production cost and the thickness of the display panel. Moreover, the first reference voltage signal line 321 may use the same material as the first plate 401 so that the first reference voltage signal line 321 and the first plate 401 can be prepared in the same process, thereby shortening the preparation time.

Further, as shown in FIG. 9 and FIG. 17, the second reference voltage signal line 322 may be disposed in the same layer as the first source-drain electrode layer 26 so that the configuration of a metal layer can be saved, thereby reducing the production cost and the thickness of the display panel. Moreover, the second reference voltage signal line 322 may use the same material as the first source-drain electrode layer 26 so that the second reference voltage signal line 322 and the first source-drain electrode layer 26 can be prepared in the same process, thereby shortening the preparation time.

Further, when the first connection line 31 and the first reference voltage signal line 321 are disposed in different layers and, in the thickness direction of the display panel, at least partially overlap, the first connection line 31 and the second reference voltage signal line 322 may be disposed in the same layer so that the configuration of a metal layer can be saved, thereby reducing the production cost and the thickness of the display panel. Moreover, the first connection line 31 may use the same material as the second reference voltage signal line 322 so that the first connection line 31 and the second reference voltage signal line 322 can be prepared in the same process, thereby shortening the preparation time.

Further, when the first connection line 31 and the second reference voltage signal line 322 are disposed in different layers and, in the thickness direction of the display panel, at least partially overlap, the first connection line 31 and the first reference voltage signal line 321 may be disposed in the same layer so that the configuration of a metal layer can be saved, thereby reducing the production cost and the thickness of the display panel. Moreover, the first connection line 31 may use the same material as the first reference voltage signal line 321 so that the first connection line 31 and the first reference voltage signal line 321 can be prepared in the same process, thereby shortening the preparation time.

It is to be noted that the specific film positions of the first reference voltage signal line 321 and the second reference voltage signal line 322 are not limited to the preceding embodiment, and the first reference voltage signal line 321 and the second reference voltage signal line 322 may also be disposed in the same layer as any metal film, such as the first gate layer 25, the first source-drain electrode layer 26, the first plate 401, the second plate 402 or the light-shielding metal layer 41, in other embodiments. This is not limited in this embodiment of the present disclosure.

With continued reference to FIG. 9, optionally, the display panel further includes the first power signal line 18 configured to transmit the first power signal. The pixel circuit 14 includes the data signal write transistor 27, the drive transistor 28 and the compensation transistor 29. The drive transistor 28 is connected in series between the first power signal line 18 and the light-emitting element 30. The first electrode D3 of the drive transistor 28 is electrically connected to the first electrode S2 of the data signal write transistor 27, the second electrode S3 of the drive transistor 28 is electrically connected to the first electrode D4 of the compensation transistor 29, and the second electrode S4 of the compensation transistor 29 is electrically connected to the gate G3 of the drive transistor 28. In the pixel circuit 14 of the first display sub-region 101, the second electrode D2 of the data signal write transistor 27 is electrically connected to the second signal line 15 through a first via 35. In the second direction Y, the distance between the first connection line 13 and the first via 35 is d2, where d2>0.

The light-emitting element 30 is configured to emit light in the light emission stage so that the light emission function of the display panel or the display function of the display panel can be fulfilled.

The drive transistor 28 may be turned on according to the potential of the gate of the drive transistor 28, and the drive current formed by turning on the drive transistor 28 is configured to drive the light-emitting element 30 to emit light.

The driving process of the pixel circuit 14 may include the following.

In the data signal voltage write stage, the data signal write transistor 27, the compensation transistor 29 and the drive transistor 28 are turned on, so in the pixel circuit 14 of the first display sub-region 101, the data signal voltage on the second signal line 15 is applied to the first node N1 (that is, the gate G3 of the drive transistor 28) through the data signal write transistor 27, the drive transistor 28 and the compensation transistor 29; in the pixel circuit 14 of the second display region 11, the data signal voltage on the first signal line 13 is applied to the first node N1 (that is, the gate G3 of the drive transistor 28) through the data signal write transistor 27, the drive transistor 28 and the compensation transistor 29.

In the light emission stage, the first power signal on the first power signal line 18 is transmitted to the light-emitting element 30 through the drive transistor 28 so that the drive current generated by the drive transistor 28 can be supplied to the light-emitting element 30 to drive the light-emitting element 30 to emit light.

Exemplarily, the second electrode D2 of the data signal write transistor 27 is located in the first source-drain electrode layer 26, the second signal line 15 may be disposed on one side of the first source-drain electrode layer 26 facing away from the base substrate 23, and the data signal write transistor 27 is electrically connected to the second signal line 15 through the first via 35 so that the first type of signal on the second signal line 15 can be transmitted to the data signal write transistor 27 through the first via 35.

As shown in FIG. 9, the distance d2 between the first connection line 13 and the first via 35 in the second direction Y is greater than 0, that is, there is a gap between the first connection line 13 and the first via 35 so that a short circuit between the first connection line 13 and the second signal line 15 can be prevented, thereby ensuring the reliability of the pixel circuit 14.

It is to be noted that the specific value of the distance d2 between the first connection line 13 and the first via 35 may be disposed according to actual needs and is not limited in this embodiment of the present disclosure. It is to be understood that the larger the distance d2 between the first connection line 13 and the first via 35, the smaller the mutual interference between the first connection line 13 and the first via 35, but the smaller the distance d2 between the first connection line 13 and the first via 35, the more advantageous it is to compress the size of the pixel circuit 14 so that the pixel density of the display panel can be improved.

It is to be noted that, as shown in FIG. 9, the size of the first via 35 is generally larger due to the limitation of the preparation process to ensure the reliability of the connection between the data signal write transistor 27 and the second signal line 15. To ensure that the distance d2 between the first connection line 13 and the first via 35 is greater than 0, the first connection line 13 may be disposed as a polyline to avoid the first via 35, which may be disposed by those skilled in the art according to actual needs and is not limited in this embodiment of the present disclosure.

As shown in FIGS. 1 to 10, optionally, the first display region 10 further includes a second display sub-region 102. The second display sub-region 102 includes a fifth signal line 36 extending in the second direction Y and configured to supply the first type of signal to a pixel circuit 14 of the second display sub-region 102.

Figure 18:
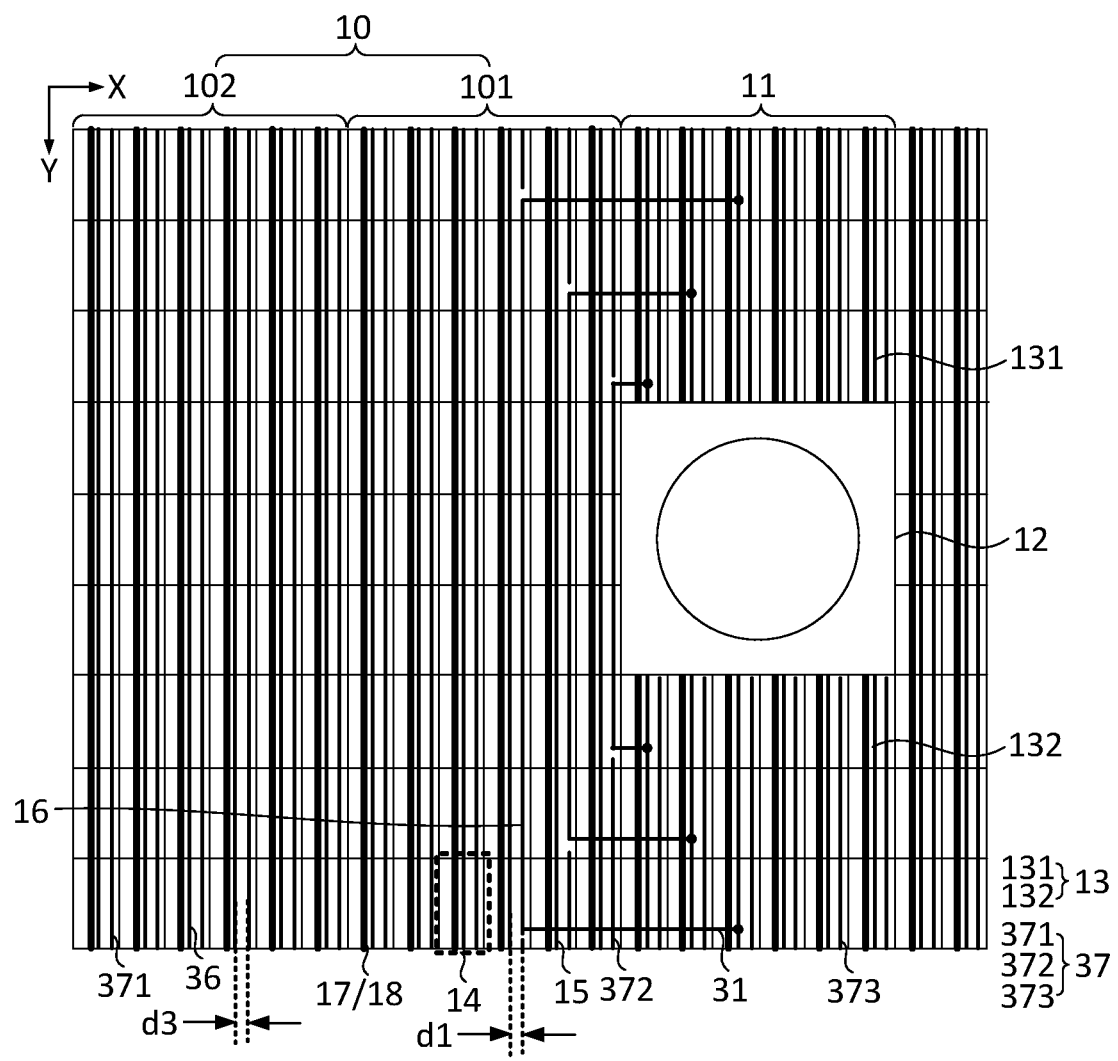
FIG. 18 is a partial view of the structure of another display panel according to embodiments of the present disclosure.
Figure 19:
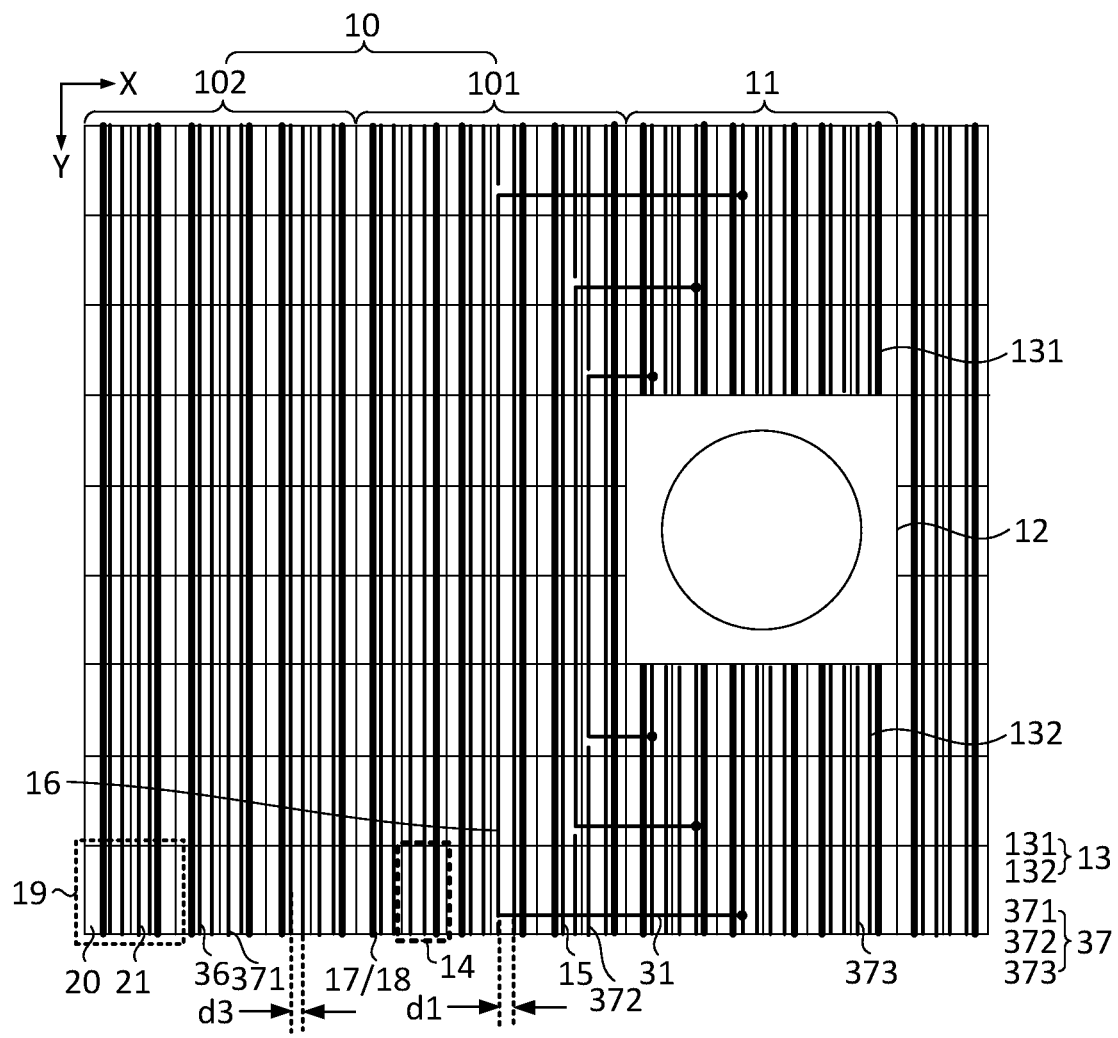
FIG. 19 is a partial view of the structure of another display panel according to embodiments of the present disclosure.
Figure 20:
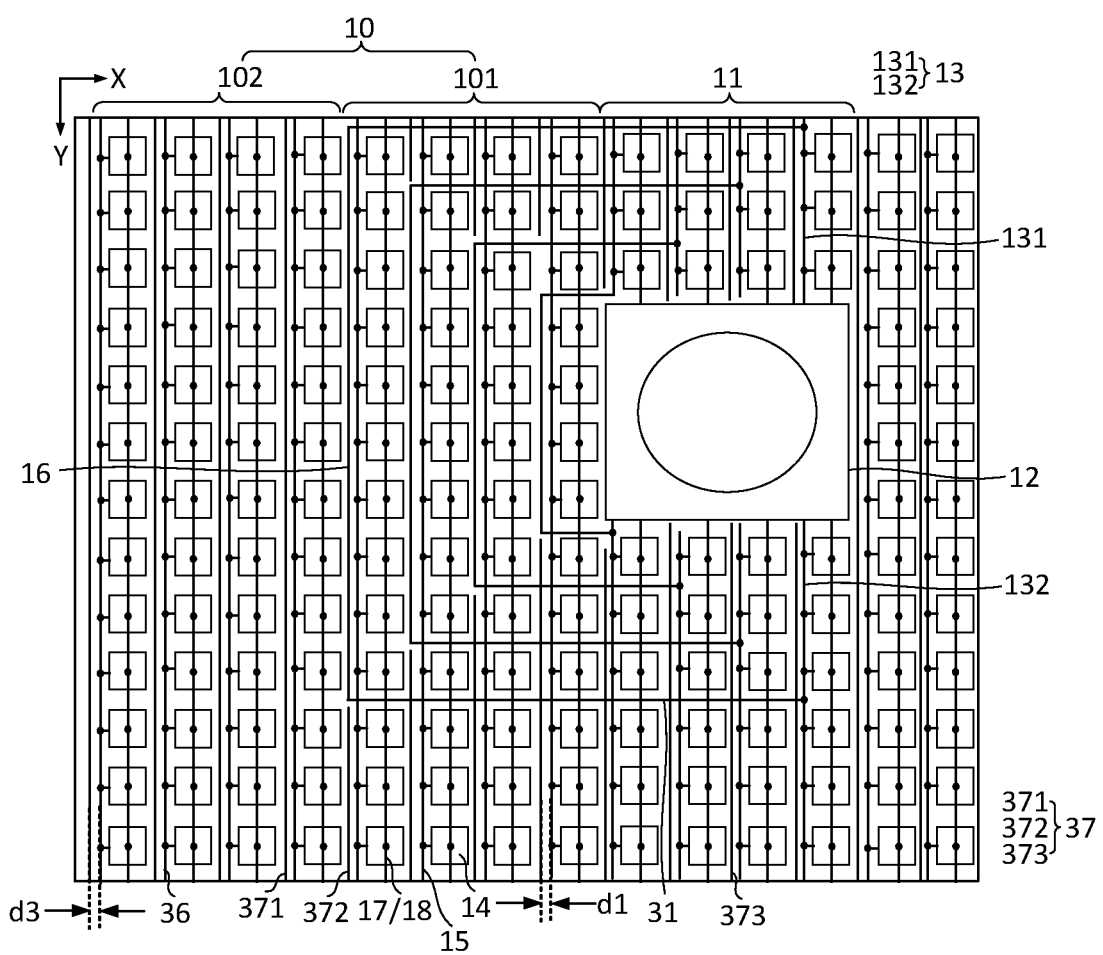
FIG. 20 is a partial view of the structure of another display panel according to embodiments of the present disclosure.
Figure 21:
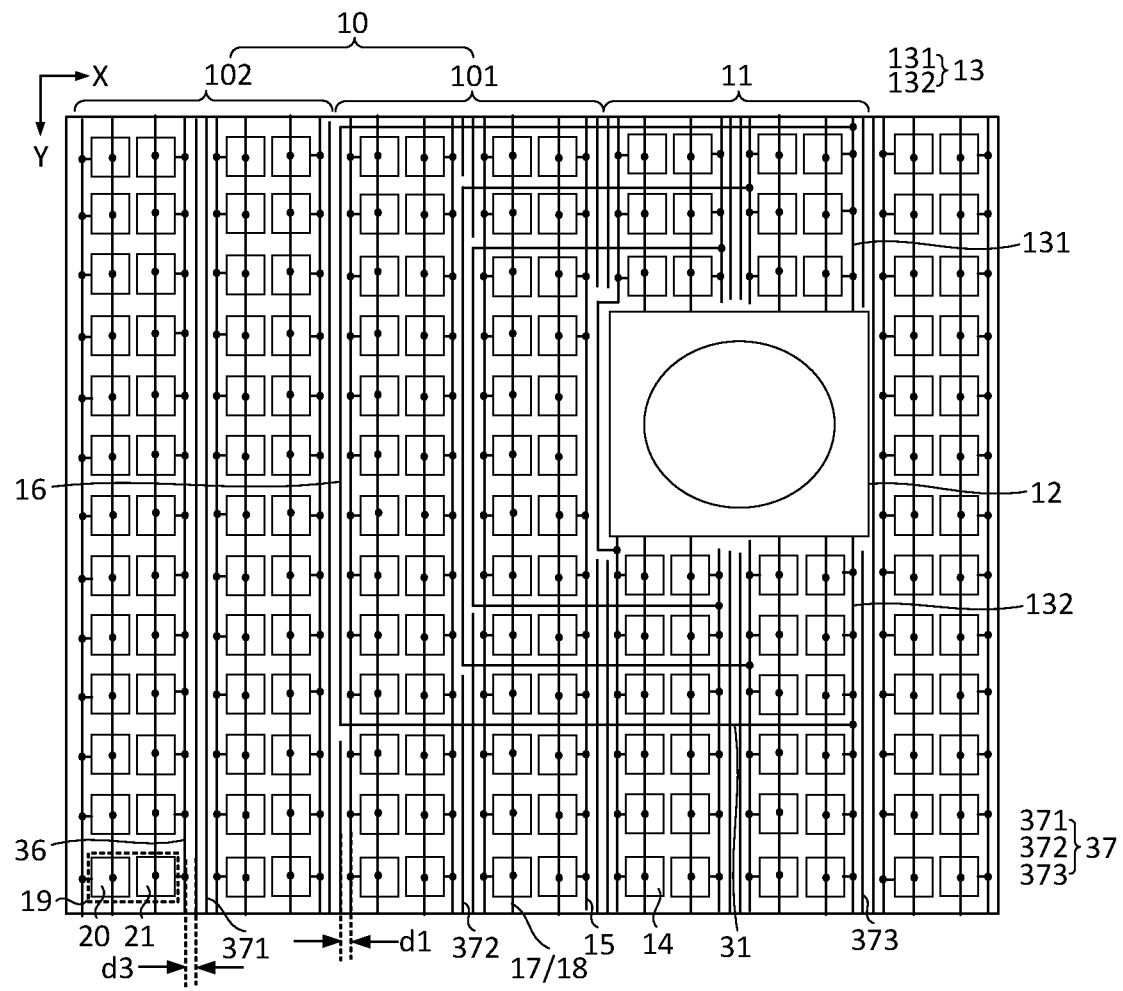
FIG. 21 is a partial view of the structure of another display panel according to embodiments of the present disclosure.

FIG. 18 is a partial view of the structure of another display panel according to embodiments of the present disclosure. FIG. 19 is a partial view of the structure of another display panel according to embodiments of the present disclosure. FIG. 20 is a partial view of the structure of another display panel according to embodiments of the present disclosure. FIG. 21 is a partial view of the structure of another display panel according to embodiments of the present disclosure. As shown in FIGS. 18 to 21, the display panel according to this embodiment of the present disclosure further includes a virtual signal line 37 extending in the second direction Y and including a first virtual signal line 371 located in the second display sub-region 102, and in the same pixel circuit 14 of the second display sub-region 102, the fifth signal line 36 and the first virtual signal line 371 are located on the same side of the fourth signal line 17. The virtual signal line 37 further includes a second virtual signal line 372 located in the first display sub-region 101, and the second virtual signal line 372 and the third signal line 16 are arranged in the second direction Y and are insulated from each other. The virtual signal line further includes a third virtual signal line 373 located in the second display region 11, and in the same pixel circuit 14 of the second display region 11, the first signal line 13 and the third virtual signal line 373 are located on the same side of the fourth signal line 17.

Specifically, as shown in FIGS. 1 to 8, since the first display sub-region 101 is added with the third signal line 16 extending in the second direction Y, the wring density in the second direction Y in the first display sub-region 101 is greater than the wring densities in the second direction Y in other display regions, and the reflected light is different due to different wring densities in the second direction Y of different regions of the display region, affecting the overall visual effect of the display panel.

With continued reference to FIGS. 18 to 21, in this embodiment, the second display sub-region 102 is provided with the first virtual signal line 371 extending in the second direction Y, and in the same pixel circuit 14 of the second display sub-region 102, the fifth signal line 36 and the first virtual signal line 371 are located on the same side of the fourth signal line 17. The first virtual signal line 371 is configured to compensate for the wiring density in the second direction Y of the second display sub-region 102 so that the wiring density in the second direction Y of the second display sub-region 102 and the wiring density in the second direction Y of the first display-region 101 can tend to be consistent, thereby improving the problem of different reflections and ensuring the overall visual effect of the display panel.

The positional relationship between the first virtual signal line 371 and the corresponding pixel circuit 14 may be disposed with reference to the positional relationship between the third signal line 16 and the corresponding pixel circuit 14 so that the wires of the second display sub-region 102 and the first display sub-region 101 can be uniformly distributed in the second direction Y, thereby further improving the problem of different reflections of the second display sub-region 102 and the first display sub-region 101.

Further, with continued reference to FIGS. 18 to 21, the first display sub-region 101 is provided with the second virtual signal line 372 extending in the second direction Y, and the second virtual signal line 372 and the third signal line 16 are arranged in the second direction Y and are insulated from each other so that the second virtual signal line 372 can be prevented from affecting the signal transmission of the third signal line 16. The second virtual signal line 372 is configured to compensate for the wiring density in the second direction Y of the region not provided with the third signal line 16 in the first display sub-region 101 so that the wiring density in the second direction Y of the region not provided with the third signal line 16 in the first display sub-region 101 and the wiring density in the second direction Y of the region provided with the third signal line 16 in the first display sub-region 101 can tend to be consistent, thereby improving the problem of different reflections.

The positional relationship between the second virtual signal line 372 and the corresponding pixel circuit 14 may be disposed with reference to the positional relationship between the third signal line 16 and the corresponding pixel circuit 14. For example, the second virtual signal line 372 and the third signal line 16 are located on the same straight line so that the wires of the region not provided with the third signal line 16 in the first display sub-region 101 and the region provided with the third signal line 16 in the first display sub-region 101 can be uniformly distributed in the second direction Y, thereby further improving the problem of different reflections of the first display sub-region 101. Meanwhile, the second virtual signal line 372 and the third signal line 16 are disconnected from each other to ensure the insulation between the second virtual signal line 372 and the third signal line 16.

Further, with continued reference to FIGS. 18 to 21, the second display region 11 is provided with the third virtual signal line 373 extending in the second direction Y, and in the same pixel circuit 14 of the second display region 11, the first signal line 13 and the third virtual signal line 373 are located on the same side of the fourth signal line 17. The third virtual signal line 373 is configured to compensate for the wiring density in the second direction Y of the second display region 11 so that the wiring density in the second direction Y of the second display region 11 and the wiring density in the second direction Y of the first display-region 101 can tend to be consistent, thereby improving the problem of different reflections.

The positional relationship between the third virtual signal line 373 and the corresponding pixel circuit 14 may be disposed with reference to the positional relationship between the third signal line 16 and the corresponding pixel circuit 14 so that the wires of the second display region 11 and the first display sub-region 101 can be uniformly distributed in the second direction Y, thereby further improving the problem of different reflections of the second display region 11 and the first display sub-region 101.

It is to be noted that the positional relationship between the virtual signal line 37 and the corresponding pixel circuit 14 may be disposed with reference to the positional relationship between the third signal line 16 and the corresponding pixel circuit 14. For example, as shown in FIG. 18 and FIG. 19, when the third signal line 16 and the pixel circuit 14 overlap, the virtual signal line 37 and the pixel circuit 14 also overlap. For example, as shown in FIG. 20 and FIG. 21, when the third signal line 16 is located between two adjacent pixel circuits 14, the virtual signal line 37 is also located between the two adjacent pixel circuits 14 so that the wiring density in the second direction Y of the overall display region can tend to be consistent, thereby improving the problem of different reflections.

Optionally, the third type of signal is applied to the virtual signal line 37 and is a fixed voltage signal.

A fixed voltage signal is applied to the virtual signal line 37 so that the voltage on the virtual signal line 37 can be a constant voltage. This configuration can reduce the effect of the virtual signal line 37 on the pixel circuit 14.

Meanwhile, since the voltage on the virtual signal line 37 is a constant voltage, the virtual signal line 37 can shield the signal lines and the signal nodes that overlap the virtual signal line 37 so that the mutual interference between the signal lines and the signal nodes in the pixel circuit 14 can be reduced, and the driving performance of the pixel circuit 14 can be improved.

With continued reference to FIGS. 18 to 21, optionally, the display panel according to this embodiment of the present disclosure further includes the first power signal line 18 configured to transmit the first power signal, and the fixed voltage signal is the same as the first power signal.

Specifically, as shown in FIGS. 18 to 21, the virtual signal line 37 may be electrically connected to the first power signal line 18, and since the first power signal is a direct current signal instead of an alternating current (AC) signal, the first power signal line 18 can supply a constant fixed voltage to the virtual signal line 37. On one hand, the effect of the virtual signal line 37 on the pixel circuit 14 can be reduced. On the other hand, the voltage on the virtual signal line 37 is a constant voltage so that the virtual signal line 37 can shield the signal lines and the signal nodes that overlap the virtual signal 37, thereby helping reduce the mutual interference between the signal lines and the signal nodes in the pixel circuit 14 and improving the driving performance of the pixel circuit 14.

In addition, after the first power signal line 18 is electrically connected to the virtual signal line 37, the wiring area of the first power signal line 18 can be enlarged so that the resistance of the first power signal line 18 can be reduced, thereby reducing the drop (IR drop) of the first power signal on the first power signal line 18 and helping improve the display uniformity.

As shown in FIG. 13, optionally, the display panel according to this embodiment of the present disclosure further includes the first power signal line 18 and a second power signal line 38. The first power signal line 18 is configured to transmit the first power signal. The second power signal line 38 is configured to transmit a second power signal. The voltage of the second power signal is less than the voltage of the first power signal. The fixed voltage signal is the same as the second power signal.

Specifically, as shown in FIG. 13, the drive transistor 28 and the light-emitting element 30 are connected in series between the first power signal line 18 and the second power signal line 38. In the light emission stage, a current path is formed from the first power signal line 18, the drive transistor 28 and the light-emitting element 30 to the second power signal line 38 so that the drive current generated by the drive transistor 28 can be transmitted to the light-emitting element 30 to drive the light-emitting element 30 to emit light.

The first power signal line 18 is configured to supply the first power signal to the pixel circuit 14, the second power signal line 38 is configured to supply the second power signal to the pixel circuit 14, and the first power signal and the second power signal are each a direct current signal instead of an alternating current (AC) signal, so the first power signal line 18 and the second power signal line 38 can each supply a fixed voltage to the pixel circuit 14. The voltage of the second power signal is less than the voltage of the first power signal. The first power signal line 18 may be, for example, a PVDD signal line, and the second power signal line 38 may be, for example, a PVEE signal line. This is not limited in this embodiment of the present disclosure.

Further, the virtual signal line 37 may be electrically connected to the second power signal line 38, and since the second power signal is a direct current signal instead of an alternating current (AC) signal, the second power signal line 18 can supply a constant fixed voltage to the virtual signal line 37. On one hand, the effect of the virtual signal line 37 on the pixel circuit 14 can be reduced. On the other hand, the voltage on the virtual signal line 37 is a constant voltage so that the virtual signal line 37 can shield the signal lines and the signal nodes that overlap the virtual signal 37, thereby helping reduce the mutual interference between the signal lines and the signal nodes in the pixel circuit 14 and improving the driving performance of the pixel circuit 14.

In addition, after the second power signal line 38 is electrically connected to the virtual signal line 37, the wiring area of the second power signal line 38 can be enlarged so that the resistance of the second power signal line 38 can be reduced, thereby reducing the drop (IR drop) of the second power signal on the second power signal line 38 and helping improve the display uniformity.

It is to be noted that the second power signal line 38 may be disposed in the non-display region surrounding the display region, and the virtual signal line 37 may extend into the non-display region to be connected to the second power signal line 38, which is not limited thereto, and the second power signal line 38 may also be located in the display region in other embodiments. The specific manner of the second power signal line 38 may be disposed according to actual needs and is not limited in this embodiment of the present disclosure.

With continued reference to FIGS. 18 to 21, optionally, in the same pixel circuit 14 of the first display sub-region 101, in the first direction X, the distance between the second signal line 15 and the third signal line 16 is d1, and in the same pixel circuit 14 of the second display sub-region 102, in the first direction X, the distance between the fifth signal line 36 and the first virtual signal line 37 is d3, where d$1 \geq$d$3$.

Specifically, as shown in FIGS. 18 to 21, the distance d1 between the second signal line 15 and the third signal line 16 may be equal to the distance d3 between the fifth signal line 36 and the first virtual signal line 37 so that the wires of the first display sub-region 101 and the second display sub-region 102 can be uniformly distributed in the second direction Y, thereby improving the problem of different reflections of the first display sub-region 101 and the second display sub-region 102.

In addition, since the third signal line 16 is configured to transmit the first type of signal, and the first virtual signal line 37 does not need to transmit a signal having a change in the voltage, in another embodiment, the distance d1 between the second signal line 15 and the third signal line 16 may be greater than the distance d3 between the fifth signal line 36 and the first virtual signal line 37 so that the distance between the second signal line 15 and the third signal line 16 can be larger, the signal interference between the second signal line 15 and the third signal line 16 can be reduced, and the first type of signal transmitted on the second signal line 15 and on the third signal line 16 can be more accurate and more stable, thereby helping improve the driving performance of the pixel circuit 14.

Optionally, the line width of the third signal line is W1, and the line width of the virtual signal line is W2, where W$1 \leq$W$2$.

Specifically, the line width W1 of the third signal line may be equal to the line width W2 of the virtual signal line so that the wires of the first display sub-region 101 and the second display sub-region 102 can be uniformly distributed in the second direction Y, thereby improving the problem of different reflections of the first display sub-region 101 and the second display sub-region 102.

In addition, since the third signal line 16 is configured to transmit the first type of signal, and the first virtual signal line 37 does not need to transmit a signal having a change in the voltage, in another embodiment, the line width W1 of the third signal line is less than the line width W2 of the virtual signal line so that the third signal line 16 can be thinner, the projection area of the third signal line 16 on the plane on which the display panel is located can be smaller, and the overlapping area between the third signal line 16 and other signal lines in the pixel circuit 14 can be reduced, thereby reducing parasitic capacitances between the third signal line 16 and the other signal lines in the pixel circuit 14 and the signal interference between the third signal line 16 and the other signal lines in the pixel circuit 14. In this manner, the first type of signal transmitted on third signal line 16 can be more accurate and more stable so that the driving performance of the pixel circuit 14 can be improved. Meanwhile, reducing the parasitic capacitances between the third signal line 16 and the other signal lines in the pixel circuit 14 can also help reduce the loss of the first type of signal on the third signal line 16 so that the consumption of the display panel can be reduced.

Figure 22:
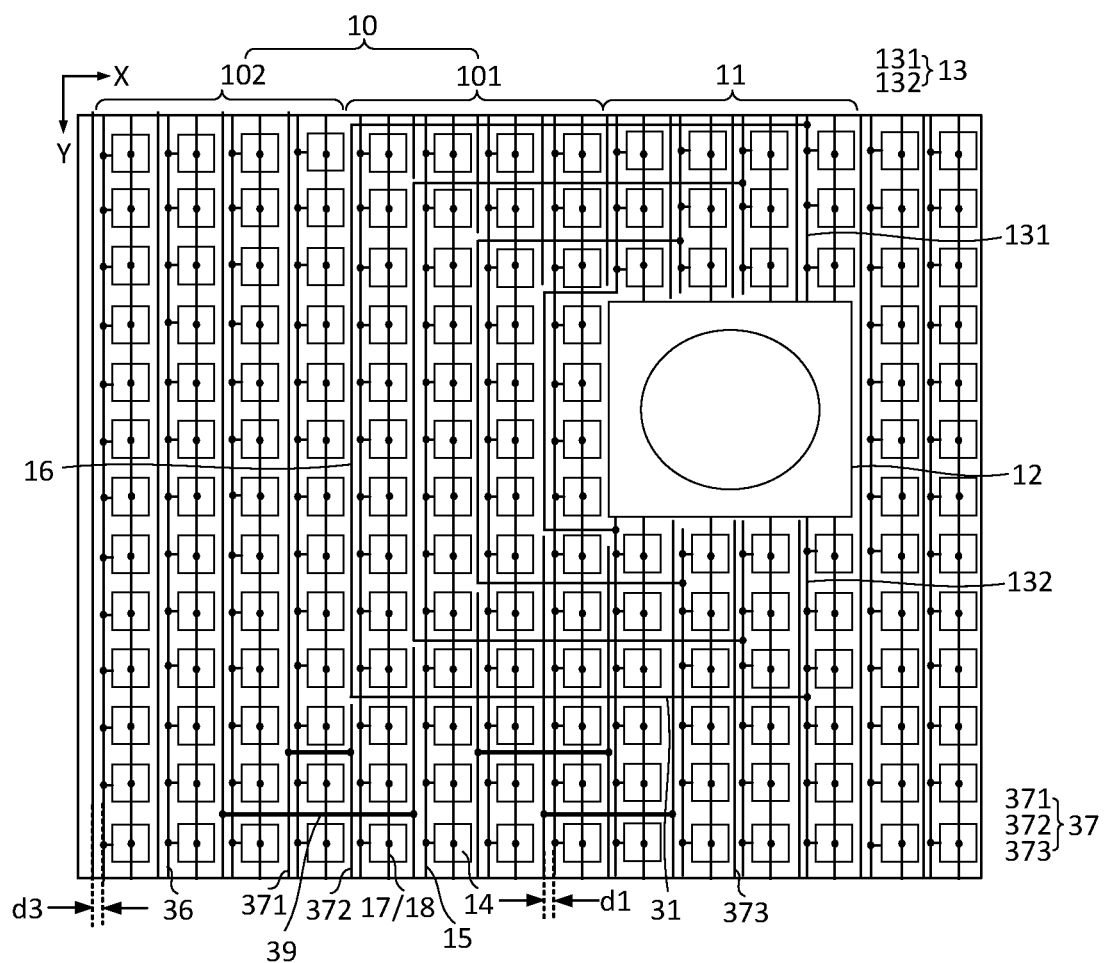
FIG. 22 is a partial view of the structure of another display panel according to embodiments of the present disclosure.
Figure 23:
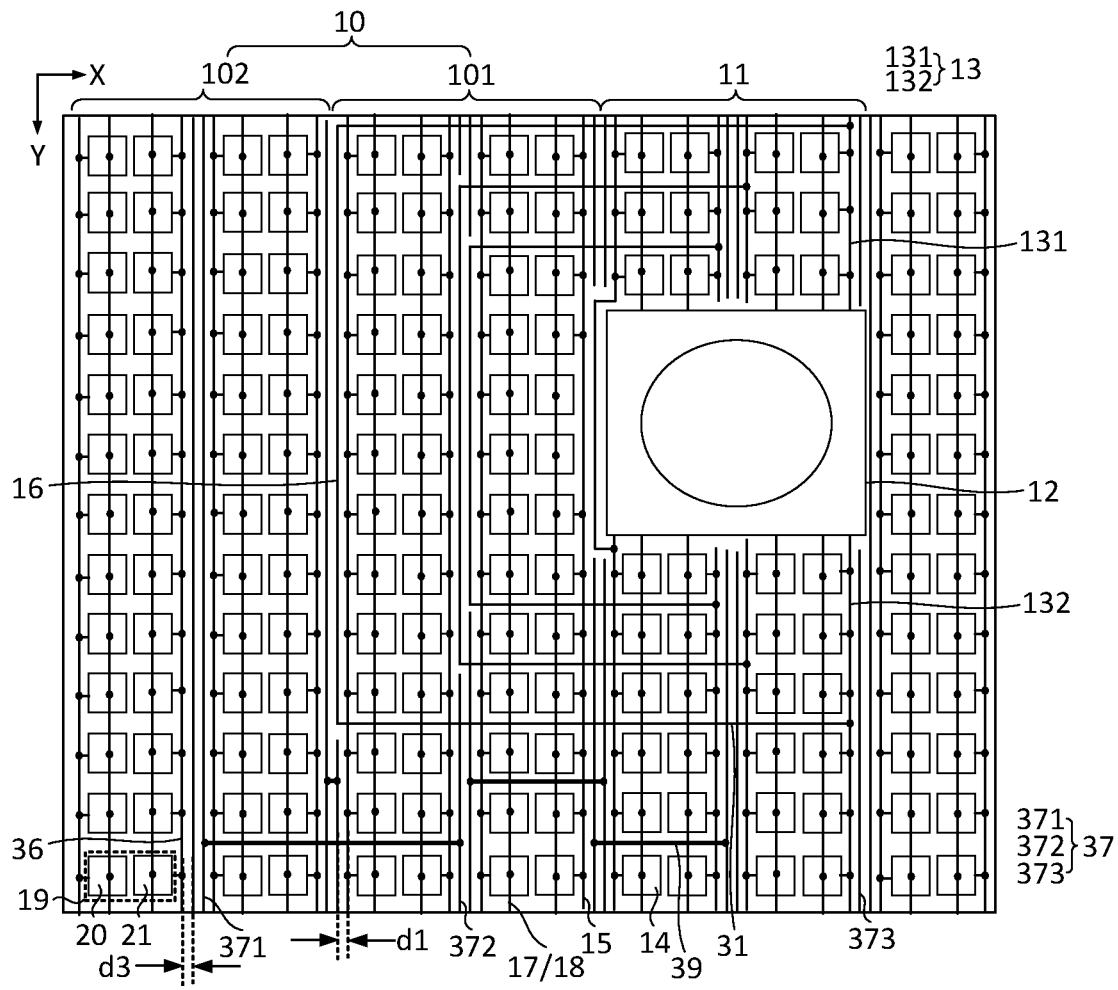
FIG. 23 is a partial view of the structure of another display panel according to embodiments of the present disclosure.

FIG. 22 is a partial view of the structure of another display panel according to embodiments of the present disclosure. FIG. 23 is a partial view of the structure of another display panel according to embodiments of the present disclosure. As shown in FIG. 22 and FIG. 23, optionally, the display panel according to this embodiment of the present disclosure further includes a second connection line 39 extending in the first direction X, and the second connection line 39 is configured to connect the first virtual signal line 371 to the second virtual signal line 372 and/or configured to connect the second virtual signal line 372 to the third virtual signal line 373.

Specifically, as shown in FIG. 22 and FIG. 23, with the configuration of the second connection line 39 extending in the first direction X, the first virtual signal line 371 of the second display sub-region 102 is electrically connected to the second virtual signal line 372 of the first display sub-region 101 through the second connection line 39 so that the fixed voltage on the first virtual signal line 371 of the second display sub-region 102 and the fixed voltage on the second virtual signal line 372 of the first display sub-region 101 can be consistent, and the effect of the first virtual signal line 371 on the corresponding pixel circuit 14 and the effect of the second virtual signal line 372 on the corresponding pixel circuit 14 can tend to be consistent, thereby helping improve the display uniformity of the first display sub-region 101 and the second display sub-region 102.

In addition, when a power signal (for example, the first power signal or the second power signal) is applied to the first virtual signal line 371 and the second virtual signal line 372, the first virtual signal line 371 is connected to the second virtual signal line 372 through the second connection line 39 so that the wiring area for transmitting the power signal can be enlarged, thereby reducing the transmission loss of the power signal and helping improve the display uniformity.

Further, as shown in FIG. 22 and FIG. 23, with the configuration of the second connection line 39 extending in the first direction X, the second virtual signal line 372 of the first display sub-region 101 is electrically connected to the third virtual signal line 373 of the second display region 11 through the second connection line 39 so that the fixed voltage on the second virtual signal line 372 of the first display sub-region 101 and the fixed voltage on the third virtual signal line 373 of the second display region 11 can be consistent, and the effect of the second virtual signal line 372 on the corresponding pixel circuit 14 and the effect of the third virtual signal line 373 on the corresponding pixel circuit 14 can tend to be consistent, thereby helping improve the display uniformity of the first display sub-region 101 and the second display region 11.

In addition, when a power signal (for example, the first power signal or the second power signal) is applied to the second virtual signal line 372 and the third virtual signal line 373, the second virtual signal line 372 is connected to the third virtual signal line 373 through the second connection line 39 so that the wiring area for transmitting the power signal can be enlarged, thereby reducing the transmission loss of the power signal and helping improve the display uniformity.

Figure 24:
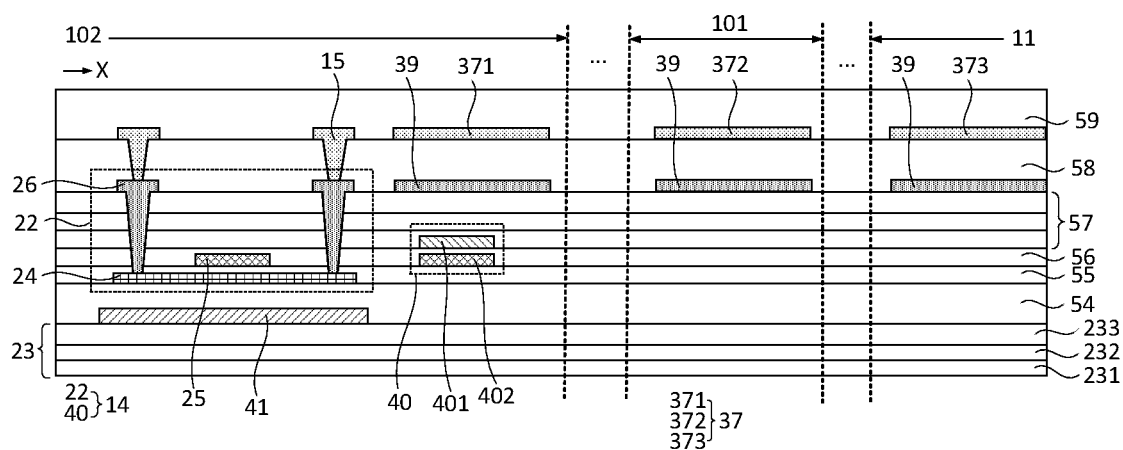
FIG. 24 is a partial section view of the structure of another display panel according to embodiments of the present disclosure.

FIG. 24 is a partial section view of the structure of another display panel according to embodiments of the present disclosure. As shown in FIG. 24, optionally, the first virtual signal line 371, the second virtual signal line 372 and the third virtual signal line 373 are located in the same film, and the second connection line 39 and the virtual signal line 37 are located in different films.

Specifically, as shown in FIG. 24, the first virtual signal line 371 of the second display sub-region 102, the second virtual signal line 372 of the first display sub-region 101 and the third virtual signal line 373 of the second display region 11 are disposed in the same layer, and in the thickness direction of the display panel, the first virtual signal line 371, the second virtual signal line 372 and the third virtual signal line 373 have the basically same vertical distances from other metal films in the pixel circuit 14 so that parasitic capacitances between other metal films in the pixel circuit 14 and the first virtual signal line 371, the second virtual signal line 372 and the third virtual signal line 373 can be at a similar level, and the effect of the first virtual signal line 371 on the corresponding pixel circuit 14, the effect of the second virtual signal line 372 on the corresponding pixel circuit 14, and the effect of the third virtual signal line 373 on the corresponding pixel circuit 14 can tend to be consistent, thereby helping improve the display uniformity of the display panel.

Meanwhile, with the configuration in which the first virtual signal line 371, the second virtual signal line 372 and the third virtual signal line 373 are disposed in the same film, the configuration of metal layers can be saved by not disposing a separate metal layer for each kind of virtual signal line so that the production cost and the thickness of the display panel can be reduced. Moreover, the first virtual signal line 371, the second virtual signal line 372 and the third virtual signal line 373 may use the same material so that the first virtual signal line 371, the second virtual signal line 372 and the third virtual signal line 373 can be prepared in the same process, thereby shortening the preparation time.

Further, as shown in FIG. 24, the second connection line 39 and the virtual signal line 37 are located in different films.

Specifically, as shown in FIG. 24, the second connection line 39 and the virtual signal line 37 are located in different films, and the second connection line 39 and the virtual signal line 37 connected to the second connection line 31 are connected by punching.

It is to be understood that the second connection line 39 extends in the first direction X, and the virtual signal line 37 extends in the second direction Y, so the second connection line 39 overlaps part of the virtual signal line 37. In this embodiment, with the configuration in which the second connection line 39 and the virtual signal line 37 are disposed in different layers, when the second connection line 39 needs to be connected to the virtual signal line 37, the connection is performed by punching; when the second connection line 39 does not need to be connected to the virtual signal line 37, punching does not need to be performed. Moreover, it is not required to configure the second connection line 39 to use a jump wire to avoid the virtual signal line 37 so that the structure can be simpler and easy to implement.

Exemplarily, as shown in FIG. 24, the virtual signal line 37 may be disposed on one side of the first source-drain electrode layer 26 facing away from the base substrate 23. The virtual signal line 37 may be formed using a Ti/Al/Ti metal stack, and since A1 has a smaller resistance, the resistance of the virtual signal line 37 can be reduced, and the line loss of the fixed voltage signal on the virtual signal line 37 can be reduced so that the voltage drop of the fixed voltage signal on the virtual signal line 37 can be reduced, and the display uniformity can be improved.

Meanwhile, the second connection line 39 may be disposed in the same layer as the first source-drain electrode layer 26. The metal film in which the first source-drain electrode layer 26 is located is generally formed using a Ti/Al/Ti metal stack, and the second connection line 39 disposed in the film in which the first source-drain electrode layer 26 is located can reduce the line loss of the fixed voltage signal on the second connection line 39 so that the voltage drop of the fixed voltage signal on the second connection line 39 can be reduced, and the display uniformity can be improved.

Further, as shown in FIG. 24, the second connection line 39 and the virtual signal line 37 are located in adjacent metal films, and in the thickness direction of the display panel, the distance between the second connection line 39 and the virtual signal line 37 can be closer so that the punching connection can be facilitated.

It is to be noted that the specific film positions of the second connection line 39 and the virtual signal line 37 are not limited to the preceding embodiment, and the second connection line 39 and the virtual signal line 37 may also be disposed in the same film as any metal film, such as the first gate layer 25, the first source-drain electrode layer 26, the first plate 401, the second plate 402 or the light-shielding metal layer 41, in other embodiments. This is not limited in this embodiment of the present disclosure.

It is to be noted that, to reduce the length of drawings, FIG. 24 only shows the related structures of the first virtual signal line 371, the second virtual signal line 372 and the third signal line 373, which does not represent the actual structure of the display panel and does not limit the protection scope of the present disclosure.

Figure 25:
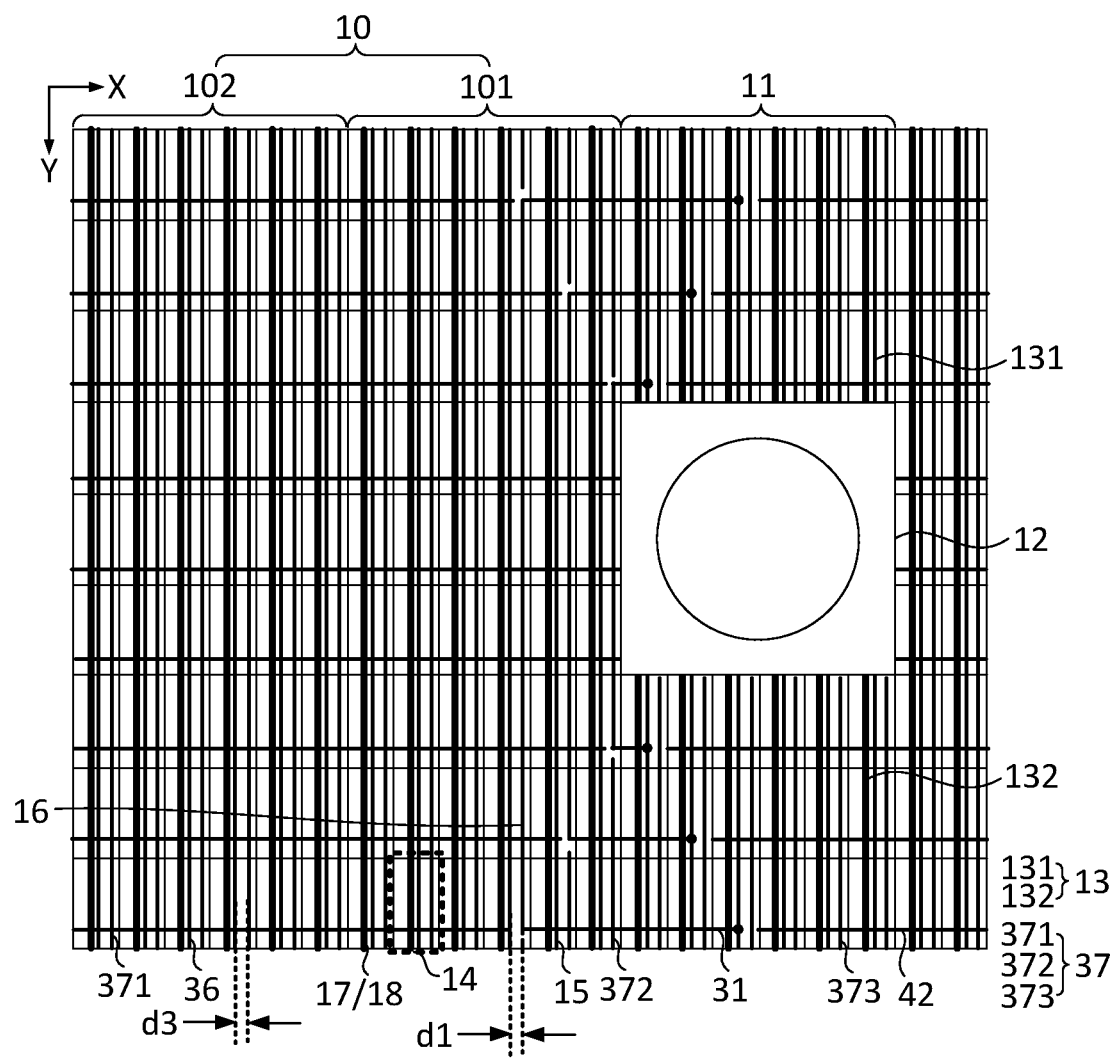
FIG. 25 is a partial view of the structure of another display panel according to embodiments of the present disclosure.
Figure 26:
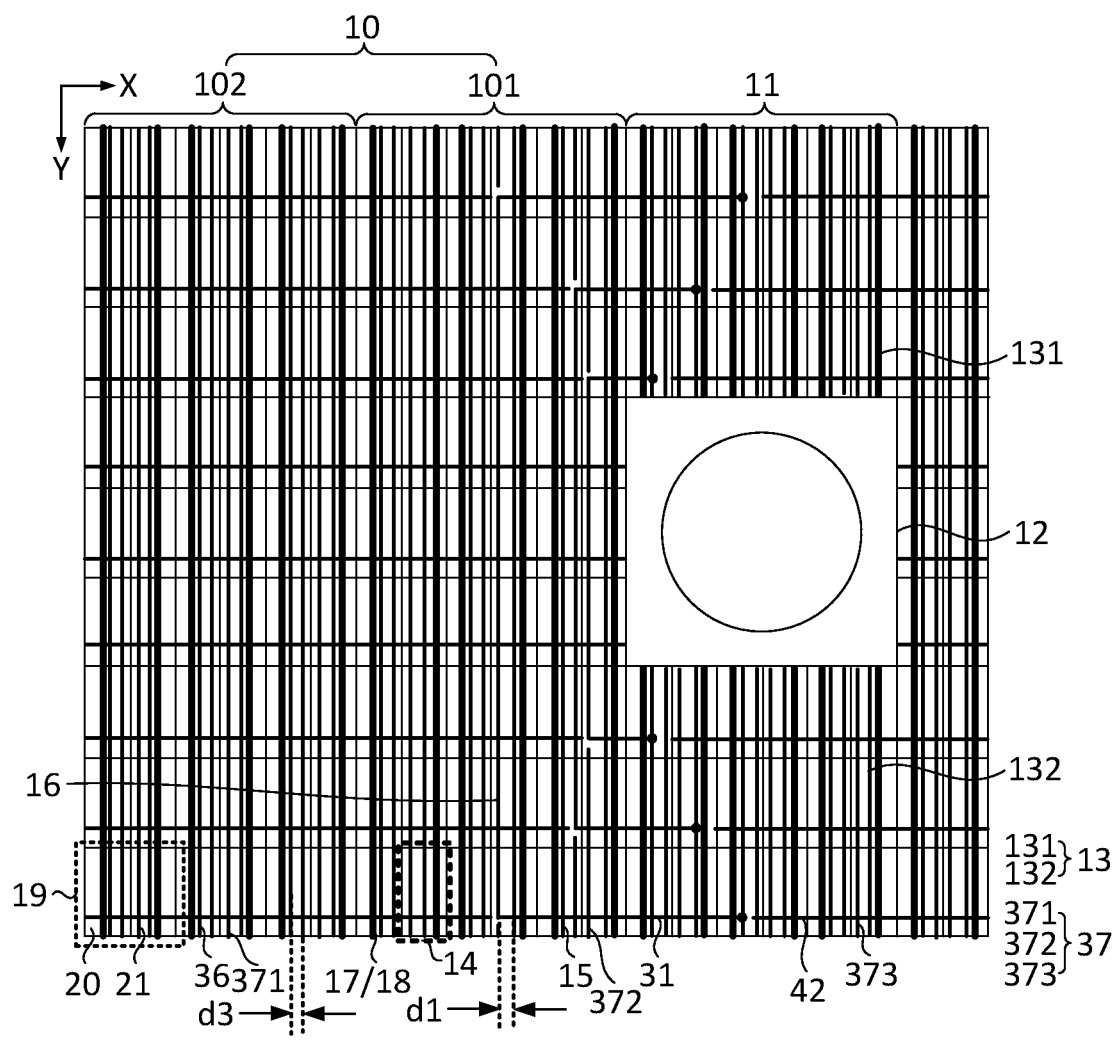
FIG. 26 is a partial view of the structure of another display panel according to embodiments of the present disclosure.
Figure 27:
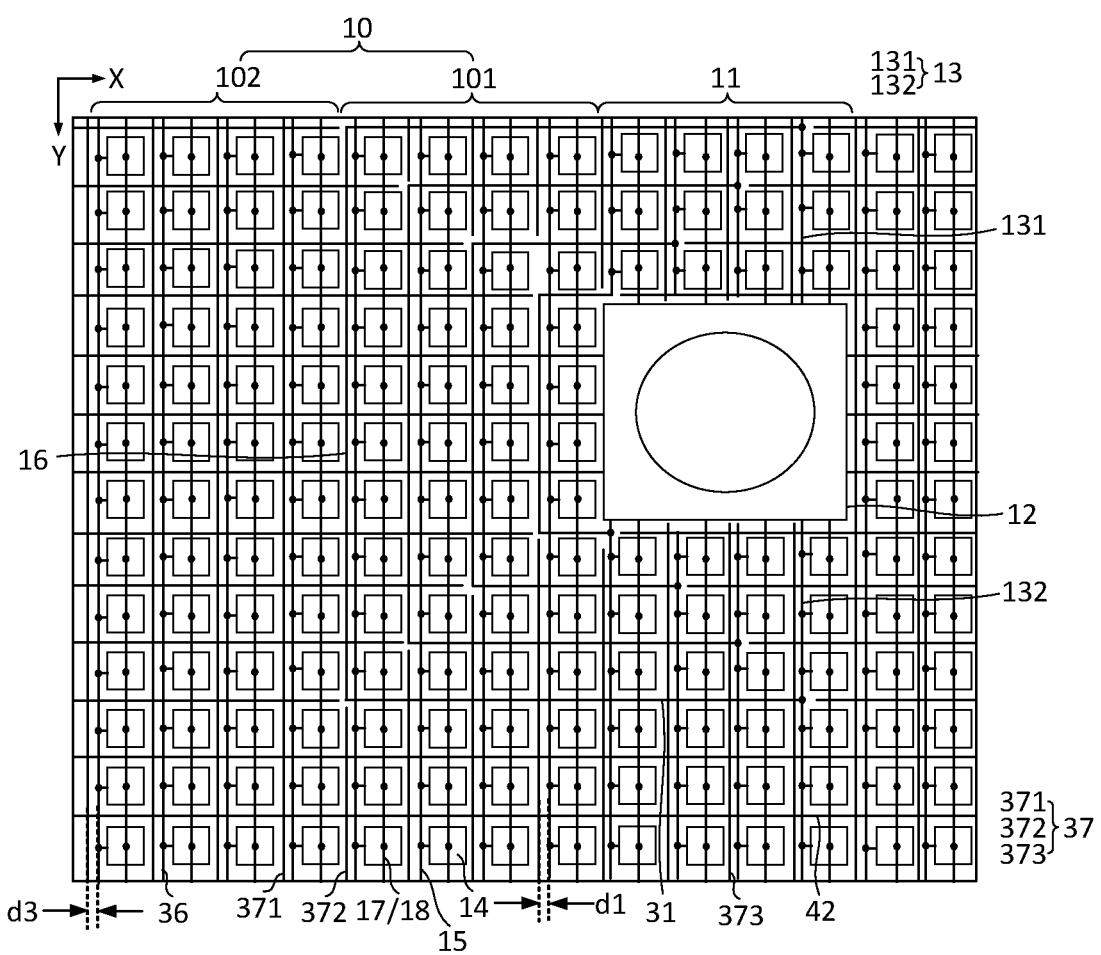
FIG. 27 is a partial view of the structure of another display panel according to embodiments of the present disclosure.
Figure 28:
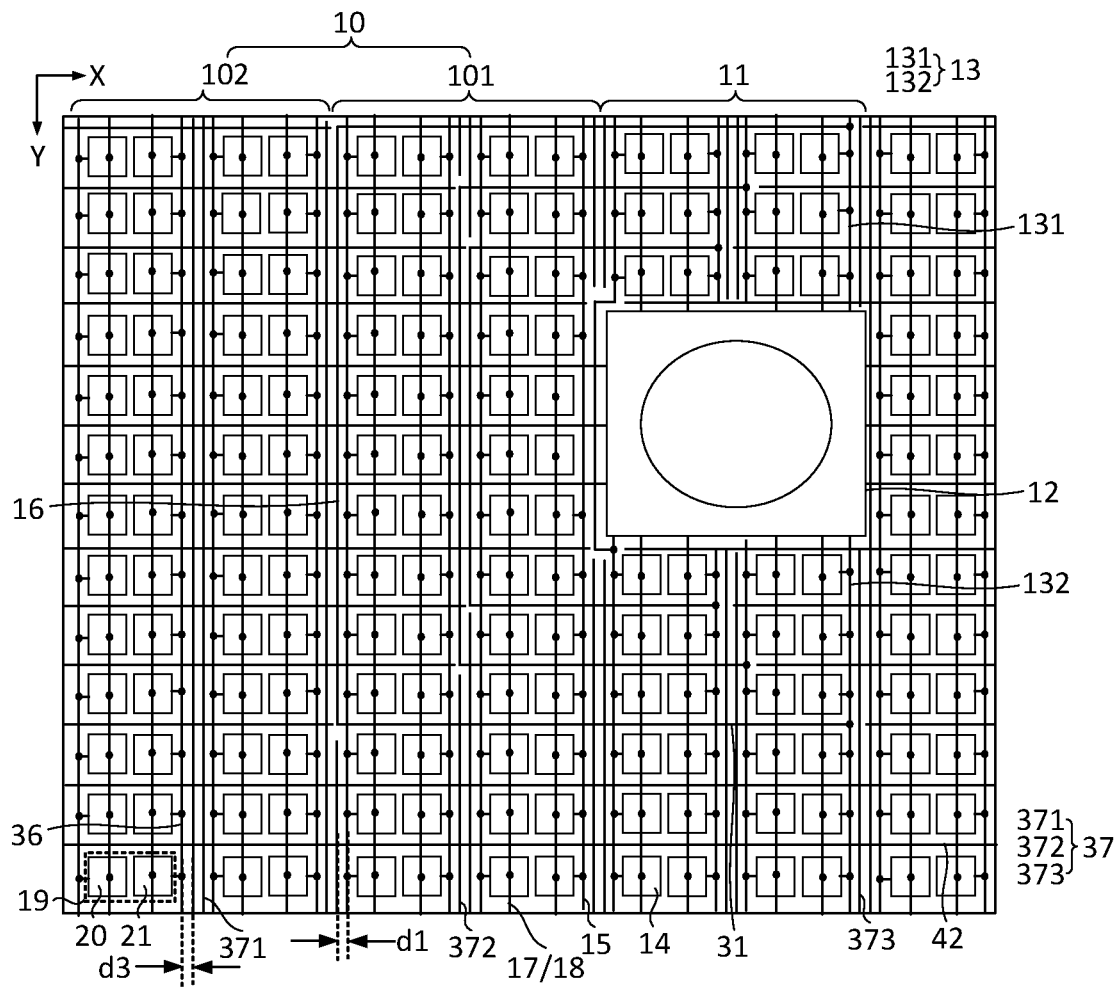
FIG. 28 is a partial view of the structure of another display panel according to embodiments of the present disclosure.

FIG. 25 is a partial view of the structure of another display panel according to embodiments of the present disclosure. FIG. 26 is a partial view of the structure of another display panel according to embodiments of the present disclosure. FIG. 27 is a partial view of the structure of another display panel according to embodiments of the present disclosure. FIG. 28 is a partial view of the structure of another display panel according to embodiments of the present disclosure. As shown in FIGS. 25 to 28, optionally, the display panel according to this embodiment of the present disclosure further includes the first connection line 31 extending in the first direction X and configured to connect the first signal line 13 in the second display region 11 to the third signal line 16 in the first display sub-region 101 and further includes a virtual connection line 42 extending in the first direction X. The virtual connection line 42 and the first connection line 31 are arranged in the first direction X and are insulated from each other.

Specifically, as shown in FIGS. 25 to 28, with the configuration of the first connection line 31 extending in the first direction X, the first segment 131 and the second segment 132 of the third signal line 16 can be led to the first display sub-region 101 so that the first segment 131 and the second segment 132 can be connected to the third signal line 16.

As shown in FIG. 25 and FIG. 26, optionally, the first connection line 31 overlaps the pixel circuit 14 in the thickness direction of the display panel, that is, the vertical projection of the first connection line 31 on the plane on which the display panel is located overlaps the vertical projection of the pixel circuit 14 on the plane on which the display panel is located, so that the first connection line 31 does not need to occupy additional space, thereby helping improve the pixel density of the display panel.

As shown in FIG. 27 and FIG. 28, optionally, the first connection line 31 may also be located between two adjacent pixel circuits 14 so that a parasitic capacitor can be prevented from being formed between the first connection line 31 and each metal film in the pixel circuits 14, thereby reducing the effect of the first connection line 31 on the performances of the pixel circuits 14.

It is to be noted that the first connection line 31 located in the display region (specifically, in the first display sub-region 101 and the second display region 11) can reduce the number of connection lines disposed in the bezel of the light-transmissive region, and even connection lines are not disposed in the bezel of the light-transmissive region so that the bezel area of the light-transmissive region can be reduced, and the screen-to-body of the array substrate can be improved.

As shown in FIGS. 1 to 8, since the display region is added with the first connection line 31 extending in the first direction X, the wiring density in the first direction X of the region in which the first connection line 31 is located is greater than the wiring densities in the first direction X of other display regions, and the problem of different reflections occurs due to different wiring densities in the first direction X of different regions of the display region in the first direction X.

With continued reference to FIGS. 25 to 28, in this embodiment, the display panel is provided with the virtual connection line 42 extending in the first direction X, the virtual connection line 42 and the first connection line 31 are arranged in the first direction X and are insulated from each other to prevent the virtual connection line 42 from affecting the signal transmission of the first connection line 31. The virtual connection line 42 is configured to compensate for the wiring density in the first direction X of the region not provided with the first connection line 31 so that the wiring density in the first direction X of the region not provided with the first connection line 31 and the wiring density in the first direction X of the region in which the first connection line 31 is located can tend to be consistent, thereby improving the problem of different reflections.

The positional relationship between the virtual connection line 42 and the corresponding pixel circuit 14 may be disposed with reference to the positional relationship between the first connection line 31 and the corresponding pixel circuit 14. For example, the virtual connection line 42 and the first connection line 31 are located on the same straight line and are disconnected from each other to ensure the insulation between the virtual connection line 42 and the first connection line 31 so that the wires of the region not provided with the first connection line 31 and the region in which the first connection line 31 is located can be uniformly distributed in the first direction X, thereby further improving the problem of different reflections.

In other embodiments, for example, as shown in FIG. 25 and FIG. 26, when the first connection line 31 overlaps the pixel circuit 14, the virtual connection line 42 also overlaps the pixel circuit 14. For example, as shown in FIG. 27 and FIG. 28, when the first connection line 31 is located between two adjacent pixel circuits 14, the virtual connection line 42 is also located between the two adjacent pixel circuits 14 so that the wiring density in the first direction X of the overall display region can tend to be consistent, thereby improving the problem of different reflections.

With continued reference to FIG. 9 and FIG. 13, optionally, the display panel according to this embodiment of the present disclosure further includes a first scan line 43, a second scan line 44, a third signal line 45, a light emission control signal line 46, the first power signal line 18, the second power signal line 38, the first reference voltage signal line 321 and the second reference voltage signal line 322, the first power signal line 18 is configured to transmit the first power signal, the second power signal line 38 is configured to transmit the second power signal, and the voltage of the second power signal is less than the voltage of the first power signal. The pixel circuit 14 includes a first light emission control transistor 47, the data signal write transistor 27, the drive transistor 28, the compensation transistor 29, the first reset transistor 33, a second light emission control transistor 48, the light emission reset transistor 34, the storage capacitor 40 and the light-emitting element 30. The gate G5 of the first reset transistor 33 is electrically connected to the first scan line 43, the first electrode S5 of the first reset transistor 33 and the second electrode S4 of the compensation transistor 29, the gate G3 of the drive transistor 28 and the second plate 402 of the storage capacitor 40 are electrically connected to each other at the first node N1, and the second electrode D5 of the first reset transistor 33 is electrically connected to the first reference voltage signal line 321. The first electrode D4 of the compensation transistor 29 is electrically connected to the second electrode S3 of the drive transistor 28 and the first electrode D6 of the second light emission control transistor 48, and the gate G4 of the compensation transistor 29 is electrically connected to the second scan line 44. The gate G1 of the first light emission control transistor 47 and the gate G6 of the second light emission control transistor 48 are both electrically connected to the light emission control signal line 46, the first electrode D1 of the first light emission control transistor 47 is electrically connected to the first power signal line 18, and the second electrode S1 of the first light emission control transistor 47 is electrically connected to the first electrode D3 of the drive transistor 28 and the first electrode S2 of the data signal write transistor 27. The second electrode S6 of the second light emission control transistor 48 is electrically connected to the anode of the light-emitting element 30 and the first electrode S7 of the light emission reset transistor 34. The second electrode D7 of the light emission reset transistor 34 is electrically connected to the second reference voltage signal line 322, and the gate G7 of the light emission reset transistor 34 is electrically connected to the third scan line 45. The gate G2 of the data signal write transistor 27 is electrically connected to the third scan line 45. The first plate 401 of the storage capacitor 40 is electrically connected to the first power signal line 18. The cathode of the light-emitting element 30 is electrically connected to the second power signal line 38. In the pixel circuit 14 of the first display sub-region 101, the second electrode D2 of the data signal write transistor 27 is electrically connected to the second signal line 15. In the pixel circuit of the second display region 11, the second electrode D2 of the data signal write transistor 27 is electrically connected to the first signal line 13.

Specifically, the driving process of the pixel circuit 14 shown in FIG. 9 and FIG. 13 is the following.

In the initialization stage, a first scan signal on the first scan line 43 turns on the first reset transistor 33, so the first reference voltage on the first reference voltage signal line 321 is applied to one terminal of the storage capacitor 40 through the first reset transistor 33, that is, the potential of the first node N1 is the first reference voltage so that the first node N1 can be reset. At this time, the potential of the gate G3 of the drive transistor 28 is also the first reference voltage.

In the data signal voltage write stage, a third scan signal on the third scan line 45 turns on the data signal write transistor 27 and the compensation transistor 29, and, at this time, the potential of the gate G3 of the drive transistor 28 is the first reference voltage, and the drive transistor 28 is also turned on, so the data signal voltage on the data signal line is applied to the first node N1 through the data signal write transistor 27, the drive transistor 28 and the compensation transistor 29 so that the data signal voltage can be written into the storage capacitor 40.

Meanwhile, in the data signal voltage write stage, a third scan signal on the third scan line 45 turns on the light emission reset transistor 34, so the light emission reset transistor 34 writes the second reference voltage on the second reference voltage signal line 322 into the anode of the light-emitting element 30 so that the anode of the light-emitting element 30 can be reset, the effect of the voltage of the anode of the light-emitting element 30 of the previous frame on the voltage of the anode of the light-emitting element 30 of the subsequent frame can be reduced, and the display uniformity can be improved.

In the light emission stage, a light emission control signal on the light emission control signal line 46 turns on the first light emission control transistor 47 and the second light emission control transistor 48 so that the drive transistor 28 can drive the light-emitting element 30 to emit light, and the light emission function of the display panel and the display function of the display panel can be fulfilled.

Figure 29:
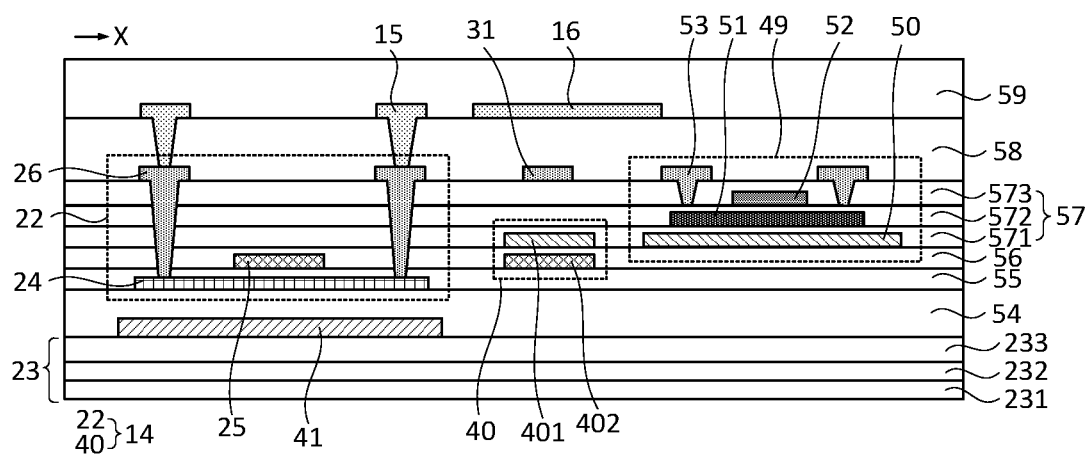
FIG. 29 is a partial section view of the structure of another display panel according to embodiments of the present disclosure.

FIG. 29 is a partial section view of the structure of another display panel according to embodiments of the present disclosure. As shown in FIGS. 9, 13 and 29, optionally, the compensation transistor 29 and the first reset transistor 33 are each an oxide-semiconductor transistor 49.

The drive transistor 28 controls the magnitude of the drive current according to the voltage of the gate of the drive transistor 28, and the magnitude of the drive current is configured to adjust the light emission brightness of the light-emitting element 30 so that the grayscale can be controlled. The compensation transistor 29 and the first reset transistor 33 are both electrically connected to the gate of the drive transistor 28 so that the performances of the compensation transistor 29 and the first reset transistor 33 can directly affect the potential of the gate of the drive transistor 28, thereby affecting the light emission brightness of the light-emitting element 30.

In this embodiment, the first reset transistor 33 may be disposed as an oxide-semiconductor transistor 49, for example, an n-type indium gallium zinc oxide (IGZO) transistor. When the first scan signal on the first scan line 43 is a high-level signal, the source-drain electrode of the n-type oxide-semiconductor transistor 49 is turned on so that the first reset transistor 33 can be turned on. Since the IGZO transistor has a low mobility and a small leakage current, the first reset transistor 33 uses the oxide-semiconductor transistor 49 so that the charge of the gate of the drive transistor 28 can be prevented from leaking away through the first reset transistor 33 during low-frequency driving, and the leakage current problem during low-frequency driving can be effectively solved, thereby making the pixel circuit 14 suitable for implementation of low-frequency driving and helping reduce the consumption of the display panel.

Further, the compensation transistor 29 may also use the oxide-semiconductor transistor 49, for example, an n-type indium gallium zinc oxide (IGZO) transistor. When the second scan signal on the second scan line 44 is a high-level signal, the source-drain electrode of the n-type oxide-semiconductor transistor 49 is turned on so that the compensation transistor 29 can be turned on. Since the IGZO transistor has a low mobility and a small leakage current, the compensation transistor 29 uses the oxide-semiconductor transistor 49 so that the charge of the gate of the drive transistor 28 can be prevented from leaking away through the compensation transistor 29 during low-frequency driving, and the effect of a leakage current on the stability of the potential of the gate of the drive transistor 28 can be effectively reduced, thereby helping improve the stability of the pixel circuit 14 during low-frequency driving.

Optionally, the first light emission control transistor 47, the data signal write transistor 27, the drive transistor 28, the second light emission control transistor 48 and the light emission reset transistor 34 may be each a p-type low-temperature polysilicon (LTPS) thin-film transistor (p-type transistor). The LTPS transistor has the advantages of a small size and good stability.

With continued reference to FIGS. 9, 13 and 29, optionally, the compensation transistor 29 and the first reset transistor 33 are each a double-gate transistor.

Since the double-gate transistor has a small leakage current, the compensation transistor 29 and the first reset transistor 33 use the double-gate transistor so that the charge of the gate of the drive transistor 28 can be prevented from leaking away through the compensation transistor 29 and the first reset transistor 33 during low-frequency driving, and the leakage current problem during low-frequency driving can be effectively solved, thereby making the pixel circuit 14 suitable for implementation of low-frequency driving and helping reduce the consumption of the display panel Meanwhile, when the compensation transistor 29 and the first reset transistor 33 are each an oxide-semiconductor transistor 49, due to the generally larger size of the oxide-semiconductor transistor 49, the compensation transistor 29 and the first reset transistor 33 are each disposed as a double-gate transistor so that the size of the compensation transistor 29 and the first reset transistor 33 can be reduced.

With continued reference to FIG. 29, exemplarily, the pixel circuit 14 may simultaneously include the first thin-film transistor 22 and the oxide-semiconductor transistor 49. The first thin-film transistor 22 is an LTPS transistor and includes the first active layer 24, the first gate layer 25 and the first source-drain electrode layer 26 that are stacked on one side of the base substrate 23, where the first gate layer 25 may be located on the first active layer 24. That is, the LTPS transistor is generally a top-gate structure. The oxide-semiconductor transistor 49 includes a second gate layer 50, a second active layer 51, a third gate layer 52 and a second source-drain electrode layer 53 that are stacked on one side of the base substrate 23, where the third gate layer 52 is located on the second active layer 51, and the second gate layer 50 is located under the second active layer 51. That is, the oxide-semiconductor transistor 49 is generally a top-bottom double-gate structure, where the third gate layer 52 is the top gate, and the second gate layer 50 is the bottom gate.

The second gate layer 50 may be located in the same film as the first plate 401, and the second source-drain electrode layer 53 may be located in the same film as the first source-drain electrode layer 26 so that the configuration of metal layers can be saved, and the production cost and the thickness of the display panel can be reduced. This is not limited thereto.

With continued reference to FIG. 9, optionally, the first power signal line 18 covers the compensation transistor 29 and the first reset transistor 33 in the thickness direction of the display panel.

The first power signal line 18 is configured to supply the first power signal to the pixel circuit 14, and the first power signal is a direct current signal instead of an alternating current (AC) signal, so the voltage on the first power signal line 18 is a constant voltage. As shown in FIG. 9, in this embodiment, the first power signal line 18 covers the compensation transistor 29 and the first reset transistor 33 so that the first power signal line 18 can shield the compensation transistor 29 and the first reset transistor 33 and reduce the effect of the signal lines on the compensation transistor 29 and the first reset transistor 33 in the pixel circuit 14, thereby stabilizing the potential of the gate of the drive transistor 28, helping improve the control precision of the drive current by the pixel circuit 14, and further improving the display effect.

With continued reference to FIG. 9 and FIG. 13, optionally, the first power signal line 18 covers the first node N1 in the thickness direction of the display panel.

Specifically, as shown in FIG. 13, the potential of the first node N1 is the potential of the gate of the drive transistor 28, so the first power signal line 18 covers the first node N1 so that the first power signal line 18 can shield the first node N1 and reduce the effect of the signal lines on the potential of the first node N1 in the pixel circuit 14, thereby stabilizing the potential of the gate of the drive transistor 28, helping improve the control precision of the drive current by the pixel circuit 14 and further improving the display effect.

With continued reference to FIG. 9, optionally, the line width of the first power signal line 18 is greater than the line width of the second signal line 15 and the line width of the third signal line 16. With the configuration in which the line width of the second signal line 15 and the line width of the third signal line 16 are smaller, the second signal line 15 and the third signal line 16 can be thinner, and the vertical projection of the second signal line 15 on the plane on which the display panel is located and the vertical projection of the third signal line 16 on the plane on which the display panel is located can be smaller so that the overlapping areas between the second signal line 15 and the third signal line 16 and other signal lines in the pixel circuit 14 can be reduced, thereby reducing parasitic capacitances between the second signal line 15 and the third signal line 16 and the other signal lines in the pixel circuit 14 and reducing the signal interference between the second signal line 15 and the third signal line 16 and the other signal lines in the pixel circuit 14. In this manner, the first type of signal transmitted on the second signal line 15 and on the third signal line 16 can be more accurate and more stable so that the driving performance of the pixel circuit 14 can be improved. Meanwhile, reducing the parasitic capacitances between the second signal line 15 and the third signal line 16 and the other signal lines in the pixel circuit 14 can also help reduce the loss of the first type of signal on the second signal line 15 and on the third signal line 16 so that the consumption of the display panel can be reduced.

Meanwhile, the line width of the first power signal line 18 is larger, that is, the first power signal line 18 is wider, so that the resistance on the first power signal line 18 can be reduced, thereby reducing the line loss of the first power signal on the first power signal line 18 and helping improve the display uniformity.

With continued reference to FIGS. 11, 12, 14 to 17, 24 and 29, optionally, the base substrate 23 may be disposed as a three-layer structure including a first substrate 231, a first inorganic layer 232 and a first substrate 233 that are sequentially disposed. With the configuration in which the first inorganic layer 232 can prevent moisture and oxygen from entering the pixel circuit 14, the driving performance of the pixel circuit 14 can be ensured.

With continued reference to FIGS. 11, 12, 14 to 17, 24 and 29, optionally, a buffer layer 54 is disposed between the light-shielding metal layer 41 and the first active layer 24 and can play roles of shockproof, buffering and isolation.

With continued reference to FIGS. 11, 12, 14 to 17, 24 and 29, optionally, one side of the buffer layer 54 facing away from the base substrate 23 is provided with a gate insulating layer 55, a capacitor insulating layer 56, an interlayer insulating layer 57, a planarization layer 58 and a passivation layer 59 that are sequentially disposed. The gate insulating layer 55 is located between the first active layer 24 and the first gate layer 25. The capacitor insulating layer 56 is located between the first plate 401 and the second plate 402. The interlayer insulating layer 57 is located between the first plate 401 and the first source-drain electrode layer 26. The planarization layer 58 is located between the first source-drain electrode layer 26 and the second signal line 15. The passivation layer 59 is located on one side of the second signal line 15 facing away from the base substrate 23.

The gate insulating layer 55, the capacitor insulating layer 56 and the interlayer insulating layer 57 may be each an inorganic film, and the planarization layer 58 and the passivation layer 59 may be each an organic film.

Further, the interlayer insulating layer 57 may include an insulating layer or multiple insulating layers. For example, as shown in FIG. 29, the interlayer insulating layer 57 may further include a first interlayer insulating layer 571, a second interlayer insulating layer 572 and a third interlayer insulating layer 573 that are stacked, where the first interlayer insulating layer 571 is located between the second gate layer 50 and the second active layer 51, the second interlayer insulating layer 572 is located between the second active layer 51 and the third gate layer 52, and the third interlayer insulating layer 573 is located between the third gate layer 52 and the second source-drain electrode layer 53. This is not limited thereto.

It is to be noted that the specific structure of the pixel circuit 14 is not limited to the preceding structure and may be disposed by those skilled in the art according to actual needs.

Figure 30:
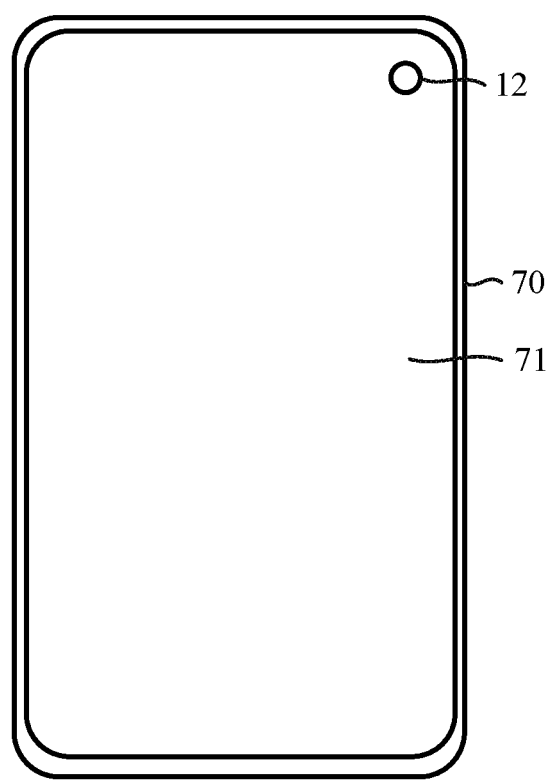
FIG. 30 is a diagram illustrating the structure of a display device according to embodiments of the present disclosure.

Based on the same inventive concept, embodiments of the present disclosure further provide a display device. FIG. 30 is a diagram illustrating the structure of a display device according to embodiments of the present disclosure. As shown in FIG. 30, the display device 70 includes the display panel 71 according to any embodiment of the present disclosure. Therefore, the display device 70 according to this embodiment of the present disclosure has the technical effects of the technical solution in any preceding embodiment, and structures which are same as or correspond to the preceding embodiments and the explanation of the terms will not be repeated here.

As shown in FIG. 30, the display panel 71 includes the first function region 12, the display device 70 includes an optical electronic element (not shown) disposed in the first function region 12, and the optical electronic element may include one or more of a photographing module, a light sensor or an ultrasonic distance sensor, which may be disposed by those skilled in the art according to actual needs.

The display device 70 according to this embodiment of the present disclosure may be the phone shown in FIG. 30 or may be any electronic product having a display function, including, but not limited to the following categories: a television, a laptop, a desktop display, a tablet computer, a digital camera, a smart bracelet, smart glasses, a vehicle-mounted display, a medical device, an industrial control device, or a touch interactive terminal. No special limitations are made thereto in this embodiment of the present disclosure.

The preceding embodiments are not intended to limit the protection scope of the present disclosure. It is to be understood by those skilled in the art that various modifications, combinations, sub-combinations and substitutions may be made according to design requirements and other factors. Any modifications, equivalent substitutions, improvements and the like made within the spirit and principle of the present disclosure shall fall within the protection scope of the present disclosure.

What is claimed is:

1. A display panel, comprising:
a first display region, a second display region and a first function region, wherein the first display region is adjacent to the first function region in a first direction, and the second display region is adjacent to the first function region in a second direction, wherein the first direction intersects the second direction;
the second display region comprises a first signal line extending in the second direction, the first signal line is configured to supply a first type of signal to a pixel circuit of the second display region, and the first signal line comprises a first segment and a second segment that are separated by the first function region;
the first display region comprises a first display sub-region;
the first display sub-region comprises a second signal line and a third signal line that extend in the second direction, the second signal line is configured to supply the first type of signal to a pixel circuit of the first display sub-region, and the third signal line is electrically connected to the first segment and the second segment;
the display panel further comprises a fourth signal line extending in the second direction and configured to transmit a second type of signal; and
in a same pixel circuit area of the first display sub-region, the second signal line and the third signal line are located on a same side of the fourth signal line;
wherein in the same pixel circuit area of the first display sub-region, the third signal line is located on one side of the second signal line facing away from the fourth signal line.

2. The display panel according to claim 1, wherein the fourth signal line is a first power signal line, and the second type of signal is a first power signal.

3. The display panel according to claim 1, wherein the second signal line, the third signal line and the fourth signal line overlap the pixel circuit of the first display sub-region in a thickness direction of the display panel.

4. A display panel, comprising:
a first display region, a second display region, a first function region and a pixel circuit group, wherein the first display region is adjacent to the first function region in a first direction, and the second display region is adjacent to the first function region in a second direction, wherein the first direction intersects the second direction;
the second display region comprises a first signal line extending in the second direction, the first signal line is configured to supply a first type of signal to a pixel circuit of the second display region, and the first signal line comprises a first segment and a second segment that are separated by the first function region;
the first display region comprises a first display sub-region;
the first display sub-region comprises a second signal line and a third signal line that extend in the second direction, the second signal line is configured to supply the first type of signal to a pixel circuit of the first display sub-region, and the third signal line is electrically connected to the first segment and the second segment;
the display panel further comprises a fourth signal line extending in the second direction and configured to transmit a second type of signal; and
in a same pixel circuit area of the first display sub-region, the second signal line and the third signal line are located on a same side of the fourth signal line;
wherein the pixel circuit group comprises a first pixel circuit and a second pixel circuit disposed adjacent to each other in the first direction and arranged in a mirror-image, and
wherein in a same pixel circuit group of the first display sub-region, in the first direction, a plurality of second signal lines are located between two adjacent third signal lines, or a plurality of third signal lines are located between two adjacent second signal lines.

5. The display panel according to claim 1, wherein the second signal line and the third signal line are located in a same film; or
the second signal line and the third signal line are located in different films; and
the second signal line and the third signal line at least partially overlap in a thickness direction of the display panel.

6. The display panel according to claim 1, wherein the first type of signal is a data signal.

7. The display panel according to claim 1, further comprising a first connection line extending in the first direction, wherein the first connection line is configured to connect the first signal line of the second display region to the third signal line of the first display sub-region.

8. The display panel according to claim 7, wherein the first connection line and the third signal line are located in different films.

9. The display panel according to claim 7, further comprising a reference voltage signal line extending in the first direction, wherein the reference voltage signal line is configured to supply a reference voltage signal to the pixel circuit; and
the first connection line and the reference voltage signal line are insulated from each other and, in a thickness direction of the display panel, at least partially overlap.

10. The display panel according to claim 7, further comprising a first power signal line, wherein the first power signal line is configured to transmit a first power signal;
the pixel circuit comprises a data signal write transistor, a drive transistor, and a compensation transistor, wherein the drive transistor is connected in series between the first power signal line and a light-emitting element;
a first electrode of the drive transistor is electrically connected to a first electrode of the data signal write transistor, a second electrode of the drive transistor is electrically connected to a first electrode of the compensation transistor, and a second electrode of the compensation transistor is electrically connected to a gate of the drive transistor; and
in the pixel circuit of the first display sub-region, a second electrode of the data signal write transistor is electrically connected to the second signal line through a first via; and
in the second direction, a distance between the first connection line and the first via is d2, wherein d2>0.

11. The display panel according to claim 1, wherein the first display region further comprises a second display sub-region;
the second display sub-region comprises a fifth signal line extending in the second direction and configured to supply the first type of signal to a pixel circuit of the second display sub-region;
wherein the display panel further comprises a virtual signal line extending in the second direction;
the virtual signal line comprises a first virtual signal line located in the second display sub-region, and in a same pixel circuit area of the second display sub-region, the fifth signal line and the first virtual signal line are located on a same side of the fourth signal line;
the virtual signal line further comprises a second virtual signal line located in the first display sub-region, the second virtual signal line and the third signal line are arranged in the second direction and are insulated from each other; and
the virtual signal line further comprises a third virtual signal line located in the second display region, and in a same pixel circuit area of the second display region, the first signal line and the third virtual signal line are located on a same side of the fourth signal line.

12. The display panel according to claim 11, wherein a third type of signal is applied to the virtual signal line, and the third type of signal is a fixed voltage signal.

13. The display panel according to claim 11, wherein in the same pixel circuit area of the first display sub-region, in the first direction, a distance between the second signal line and the third signal line is d1; and
in the same pixel circuit area of the second display sub-region, in the first direction, a distance between the fifth signal line and the first virtual signal line is d3;
wherein d1≥d3.

14. The display panel according to claim 11, wherein a line width of the third signal line is W1, and a line width of the virtual signal line is W2, wherein W1≤W2.

15. The display panel according to claim 11, further comprising a second connection line extending in the first direction, wherein the second connection line is configured to connect the first virtual signal line to the second virtual signal line, and/or configured to connect the second virtual signal line to the third virtual signal line.

16. The display panel according to claim 15, wherein
the first virtual signal line, the second virtual signal line and the third virtual signal line are located in a same film; and the second connection line and the virtual signal line are located in different films.

17. The display panel according to claim 11, further comprising a first connection line extending in the first direction, wherein the first connection line is configured to connect the first signal line of the second display region to the third signal line of the first display sub-region;

wherein the display panel further comprises a virtual connection line extending in the first direction, the virtual connection line and the first connection line are arranged in the first direction and are insulated from each other.

18. A display device, comprising a display panel, wherein the display panel comprises:

a first display region, a second display region and a first function region, wherein the first display region is adjacent to the first function region in a first direction, and the second display region is adjacent to the first function region in a second direction, wherein the first direction intersects the second direction;

the second display region comprises a first signal line extending in the second direction, the first signal line is configured to supply a first type of signal to a pixel circuit of the second display region, and the first signal line comprises a first segment and a second segment that are separated by the first function region;

the first display region comprises a first display sub-region;

the first display sub-region comprises a second signal line and a third signal line extending in the second direction, the second signal line is configured to supply the first type of signal to a pixel circuit of the first display sub-region, and the third signal line is electrically connected to the first segment and the second segment;

the display panel further comprises a fourth signal line extending in the second direction and configured to transmit a second type of signal; and in a same pixel circuit area of the first display sub-region, the second signal line and the third signal line are located on a same side of the fourth signal line;

wherein in the same pixel circuit area of the first display sub-region, the third signal line is located on one side of the second signal line facing away from the fourth signal line.

19. The display panel according to claim 1, wherein the third signal line is not electrically connected to the pixel circuit of the first display sub-region.

20. The display panel according to claim 1, further comprising a first thin-film transistor;

wherein the first thin-film transistor comprises a first active layer, a first gate layer and a first source-drain electrode layer which are stacked on one side of a base substrate; and wherein one side of the first active layer facing the base substrate is provided with a light-shielding metal layer, and the light-shielding metal layer overlaps the first active layer in a thickness direction of the display panel.

* * * * *